United States Patent
Yamada et al.

(10) Patent No.: US 8,089,208 B2
(45) Date of Patent: Jan. 3, 2012

(54) PLANAR LIGHT SOURCE DEVICE

(75) Inventors: Yasumi Yamada, Tokyo (JP); Hiroyasu Inoue, Tokyo (JP)

(73) Assignee: Zeon Corporation, Tokyo (JP)

( * ) Notice: Subject to any disclaimer, the term of this patent is extended or adjusted under 35 U.S.C. 154(b) by 54 days.

(21) Appl. No.: 12/809,357

(22) PCT Filed: Dec. 11, 2008

(86) PCT No.: PCT/JP2008/072530
§ 371 (c)(1),
(2), (4) Date: Jun. 18, 2010

(87) PCT Pub. No.: WO2009/081750
PCT Pub. Date: Jul. 2, 2009

(65) Prior Publication Data
US 2011/0198987 A1    Aug. 18, 2011

(30) Foreign Application Priority Data
Dec. 21, 2007   (JP) ................................. 2007-330753

(51) Int. Cl.
*H01J 1/62* (2006.01)
*G02B 17/00* (2006.01)
*F21V 5/00* (2006.01)

(52) U.S. Cl. ........ 313/504; 313/114; 313/116; 359/366; 359/859; 359/727; 359/853; 359/869; 362/296.07; 362/311.09; 362/311.1

(58) Field of Classification Search ........................ None
See application file for complete search history.

(56) References Cited

U.S. PATENT DOCUMENTS

| | | | |
|---|---|---|---|
| 6,199,989 B1 * | 3/2001 | Maeda et al. ................. | 359/613 |
| 2003/0053015 A1 * | 3/2003 | Minoura et al. .............. | 349/113 |
| 2005/0127542 A1 * | 6/2005 | Kaminsky et al. ........... | 264/1.34 |
| 2005/0269952 A1 | 12/2005 | Kim | |
| 2006/0285214 A1 * | 12/2006 | Haga et al. .................... | 359/619 |

(Continued)

FOREIGN PATENT DOCUMENTS

JP    6-151061 A    5/1994

(Continued)

OTHER PUBLICATIONS

International Search Report—PCT/ISA/210—for PCT/JP2008/072530.

*Primary Examiner* — Ashok Patel
(74) *Attorney, Agent, or Firm* — Birch, Stewart, Kolasch & Birch, LLP

(57) ABSTRACT

A planar light source device is provided which has high light extraction efficiency and in which a change in color tone at different viewing angles is small. The planar light source device includes, on a light emitting surface, a concavo-convex structure layer made of a resin composition. In this planar light source device, the concavo-convex structure layer has a cone, pyramid, or prism shape, and the resin composition contains a transparent resin and particles. In particular, in the planar light source device, variations in any of x- and y-chromaticity coordinates in any directions in a hemisphere on the light emitting surface are within ±0.1, the diameter of the particle is 10 μm or less, and the amount of the particles is 1 to 40 wt % based on the total amount of the resin composition. In addition, the difference in refractive index between the particles and the transparent resin is 0.05 to 0.5.

8 Claims, 19 Drawing Sheets

U.S. PATENT DOCUMENTS

| | | |
|---|---|---|
| 2007/0114523 A1 | 5/2007 | Oumi et al. |
| 2008/0013323 A1* | 1/2008 | Katsumoto et al. ............ 362/311 |
| 2011/0204773 A1* | 8/2011 | Yasuda et al. ................. 313/504 |

FOREIGN PATENT DOCUMENTS

| | | |
|---|---|---|
| JP | 2000-503163 A | 3/2000 |
| JP | 2002-237381 A | 8/2002 |
| JP | 2003-59641 A | 2/2003 |
| JP | 2003-100444 A | 4/2003 |
| JP | 2003-197364 A | 7/2003 |
| JP | 2004-54035 A | 2/2004 |
| JP | 2005-347274 A | 12/2005 |
| JP | 2006-252866 A | 9/2006 |
| JP | 2007-5277 A | 1/2007 |
| JP | 2007-165284 A | 6/2007 |
| WO | 98/17083 A1 | 4/1998 |

* cited by examiner

Comparative Example 7

Comparative Example 8

Example 3-1 (Apex angle 40°)

Example 3-1 (Apex angle 50°)

Example 4-2 (Pyramid bottom side 0.8 x pitch)

Example 4-2 (Pyramid bottom side 0.6 x pitch)

PLANAR LIGHT SOURCE DEVICE

TECHNICAL FIELD

The present invention relates to a planar light source device.

BACKGROUND ART

The luminescent bodies of organic electroluminescent devices (hereinafter may be referred to as "organic EL devices") can be formed in a planar shape, and the color of light generated therefrom can be white or a color close to white. Therefore, such organic electroluminescent devices can be used as light sources of lighting devices or in applications of backlight units for display devices.

White organic EL devices are produced as organic EL devices used in lighting applications. Many of such white devices are called the stacked or tandem type in which luminescent layers that generate complementary colors are stacked. The stacks of such luminescent layers are mainly stacks of yellow-blue layers or green-blue-red layers.

However, the efficiency of currently known white organic EL devices is not high enough for lighting applications described above. Therefore, in order to use such organic EL devices in these applications, their light extraction efficiency must be improved.

In order to improve the light extraction efficiency of organic EL devices, it is known to provide various structures on their light-extraction substrates. For example, in one proposal, prisms containing a fluorescent compound are provided on a light emitting surface (Patent Document 1: Japanese Patent Application Laid-Open No. 2002-237381). In another proposal, a micro-lens array is provided on a light emitting surface (Patent Document 2: Japanese Patent Application Laid-Open No. 2003-59641). With these structures, light can be preferably gathered, and the efficiency is thereby improved.

However, in the above-described lighting organic EL devices of the stacked type, the depths from the light emitting surface to the luminescent layers are different for different luminescent layers generating different colors. Therefore, when the above structures are used in such organic EL devices, there occurs a problem in that the color tone when the light emitting surface is viewed from a front direction is significantly different from the color tone when the light emitting surface is viewed at an oblique angle with respect to the front direction.

DISCLOSURE OF THE INVENTION

Problem to be Solved by the Invention

It is an object of the present invention to provide a planar light source device which has high light extraction efficiency and in which a change in color tone at different viewing angles is small.

Means for Solving the Problem

The present inventors have conducted extensive studies in order to solve the above problem. The present inventors have found out that the above problem can be solved by using a specific structure formed of a specific resin composition containing particles as the structure provided on the light emitting surface of a planar light source device. The present invention has been completed based on this finding.

Accordingly, the present invention provides a planar light source device comprising an organic EL luminescent element and a concavo-convex structure layer made of a resin composition and formed on a light emitting surface of the planar light source device, wherein the concavo-convex structure layer includes a plurality of concavo-convex structure portions arranged therein and having a cone, pyramid, or prism shape, the resin composition contains a transparent resin and particles, the particles have a diameter of 10 μm or less, the particles is contained in an amount of 1 to 40 wt % based on a total amount of the resin composition, and a difference in refractive index between the particles and the transparent resin is 0.05 to 0.5.

Effects of the Invention

The planar light source device of the present invention has high light extraction efficiency, and a small change in color tone at different viewing angles. Therefore, the planar light source device of the present invention is useful as, for example, a light source of a lighting device or a backlight unit for a display device such as a liquid crystal display device.

BEST MODE FOR CARRYING OUT THE INVENTION

The planar light source device of the present invention comprises, on the light emitting surface thereof, a concavo-convex structure layer made of a resin composition. The concavo-convex structure layer includes a plurality of concavo-convex structure portions arranged therein and having a cone, pyramid, or prism shape, and the resin composition for forming the concavo-convex structure layer contains a transparent resin and particles.

Figure 1:
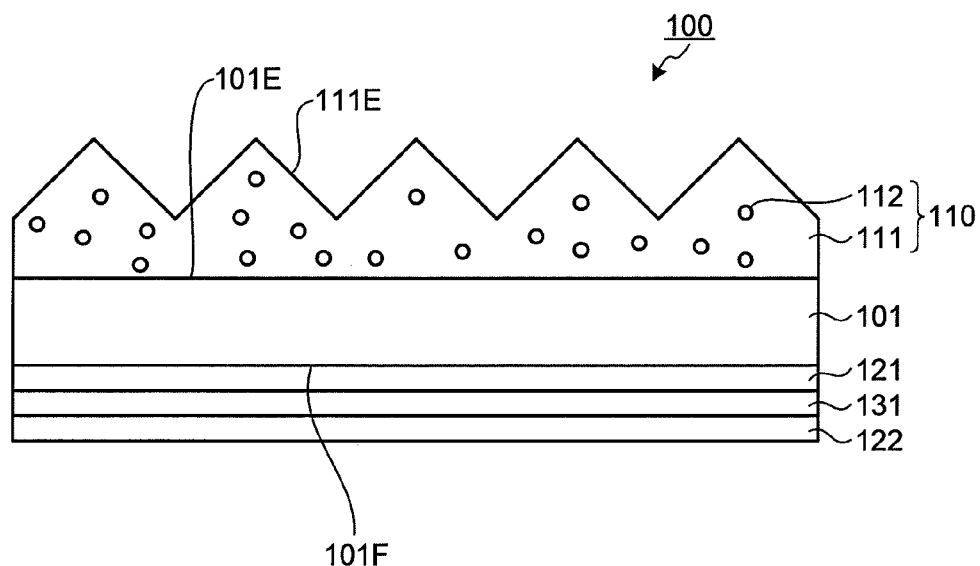
FIG. 1 is a schematic vertical cross-sectional view illustrating an example of a planar light source device of the present invention.

The aforementioned structure will be described with reference to FIG. 1. FIG. 1 is a vertical cross-sectional view illustrating an example of the organic EL lighting device serving as the planar light source device of the present invention. The planar light source device 100 comprises a concavo-convex structure layer 110 containing a transparent resin 111 and particles 112 and formed on a surface 101E of a substrate 101 on the light emitting side. In the following description of the planar light source device, unless otherwise specified, explanation will be given assuming that the planar light source device of the present invention is placed horizontally with its light emitting surface facing upward, and all the vertical cross-sectional views are taken perpendicular to the light emitting surface. The concavo-convex structure layer 110 includes a plurality of concavo-convex structure portions 111E disposed on its light emitting surface side. These concavo-convex structure portions 111E are arranged in two mutually crossing directions (the crossing angle is 90° in the present embodiment).

The term "transparent" in the transparent resin layer means that it has a light transmittance suitable for optical members, and not only the transparent resin layer 111 but also the substrate 101 has a light transmittance suitable for optical members (total light transmittance: 80% or more). More specifically, the total light transmittance of the substrate and the concavo-convex structure layer as a whole may be 80% or more.

Electrode layers and a luminescent layer are provided on the side opposite to the light emitting surface of the substrate, and these layers form a luminescent element. More specifically, a transparent electrode 121, a luminescent layer 131, and a reflecting electrode 122 are disposed in that order on a lower surface 101F of the substrate 101. If necessary, a sealing member (not shown) for sealing the luminescent layer 131 and other members and wiring leads (not shown) for supplying a current to the transparent electrode 121 and the reflecting electrode 122 are provided to form the luminescent element.

When a voltage is applied to the luminescent layer 131 through the electrodes 121 and 122, light is generated from the luminescent layer 131. The generated light directly, or after reflected from the reflecting electrode 122, passes through the transparent electrode 121, the substrate 101, and the concavo-convex structure layer 110 and is then emitted. In this planar light source device, the luminescent layer is deposited on the substrate, and the light from the luminescent layer is emitted after passing through the substrate and the concavo-convex structure layer. In this configuration, the effects of the present invention, i.e., the improvement of the light extraction efficiency and the reduction in the change in color tone at different viewing angles, can be particularly preferably obtained when the concavo-convex structure layer has any of the structures described below and made of any of the materials described below.

Figure 2:
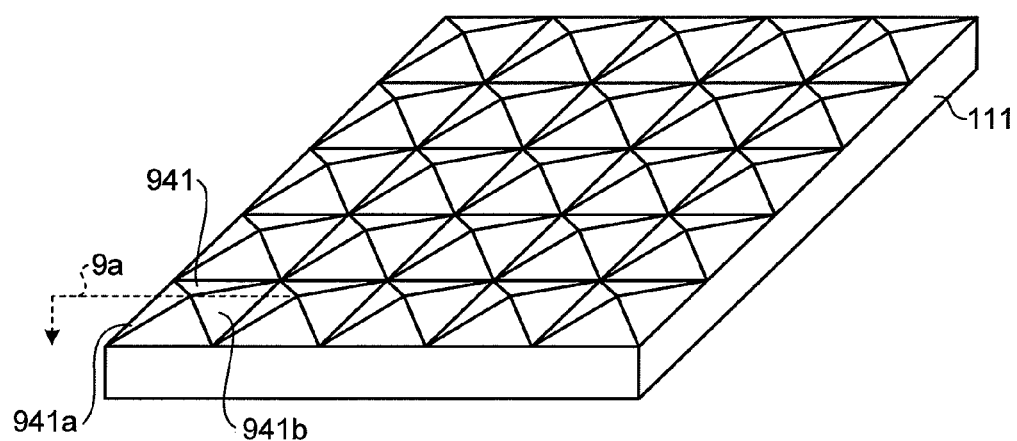
FIG. 2 is a schematic perspective view illustrating an example of the concavo-convex shape of the concavo-convex structure layer in the planar light source device of the present invention.

The concavo-convex structure portions 111E of the concavo-convex structure layer 110 have a cone, pyramid, or prism shape. The pyramid shape may be a quadrangular pyramid shape with a square bottom. For example, as shown in FIG. 2, quadrangular pyramids 941 may be arranged without gaps therebetween. The pyramid shape is not limited to the exemplary shape shown in FIG. 2, and any of triangular, pentagonal, and hexagonal pyramids and quadrangular pyramids with non-square bottoms may be arranged without gaps therebetween or with flat spacing portions therebetween.

Figure 4:
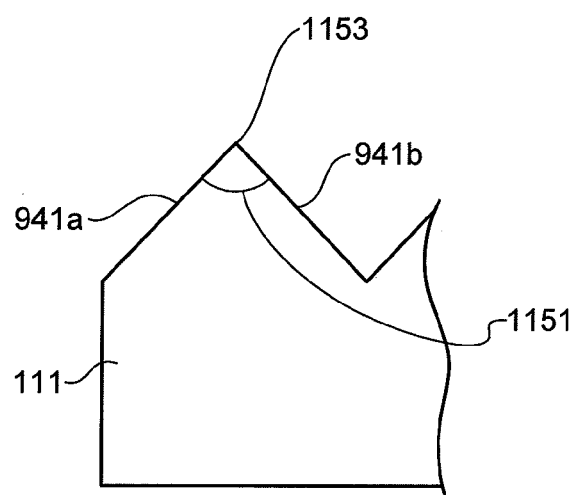
FIG. 4 is a schematic cross-sectional view illustrating an example of the concavo-convex shape of the concavo-convex structure layer in the planar light source device of the present invention.
Figure 5:
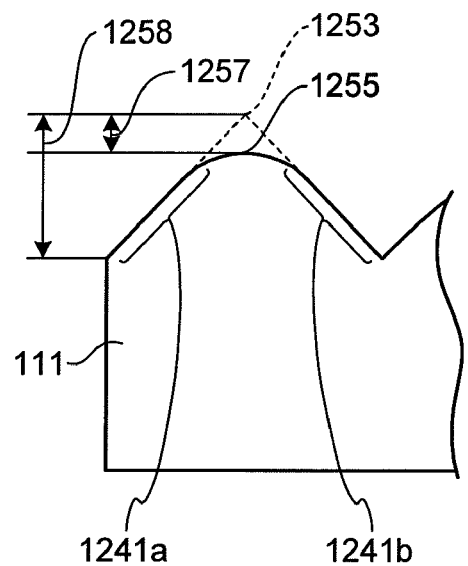
FIG. 5 is a schematic cross-sectional view illustrating another example of the concavo-convex shape of the concavo-convex structure layer in the planar light source device of the present invention.
Figure 6:
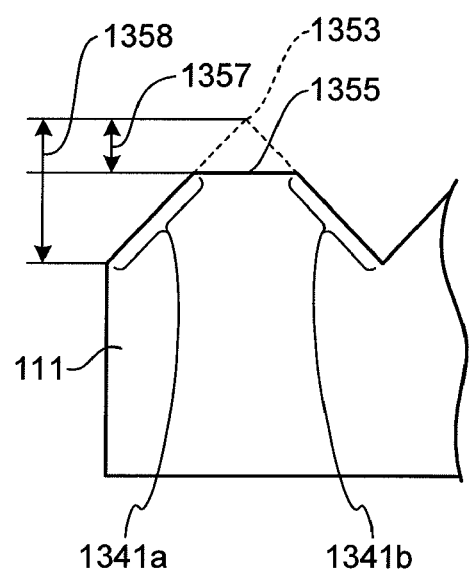
FIG. 6 is a schematic cross-sectional view illustrating another example of the concavo-convex shape of the concavo-convex structure layer in the planar light source device of the present invention.

The terms cone and pyramid shapes used in the present application encompass not only ordinary cone and pyramid shapes having sharp apexes but also cone and pyramid shapes having rounded apexes and having flat truncated apexes. These shapes are described with reference to FIGS. 4 to 6. FIG. 4 is a partial cross-sectional view obtained by cutting the quadrangular pyramid 941 in FIG. 2 along a plane that includes a line 9a and is parallel to the normals to inclined surfaces 941a and 941b of the quadrangular pyramid 941 and perpendicular to the direction of the surface of the substrate. In the example shown in FIG. 4, an apex 1153 of the quadrangular pyramid is sharp. The apex of a quadrangular pyramid may have a rounded shape as in an apex 1255 shown in FIG. 5. As shown in FIG. 6, a flat portion 1355 may be provided in the apex of a pyramid to form a flat truncated shape.

When the apex of a pyramid has a rounded shape, the difference 1257 in height between the apex 1255 and an apex 1253, which is a non-rounded sharp apex of the pyramid, may be 20% or less of the height 1258 of the pyramid with the non-rounded sharp apex. When the apex of a pyramid has a flat truncated shape, the difference 1357 in height between a flat portion 1355 and an apex 1353, which is a non-flat sharp apex of the pyramid, may be 20% or less of the height 1358 of the pyramid with the non-flat sharp apex.

Figure 7:
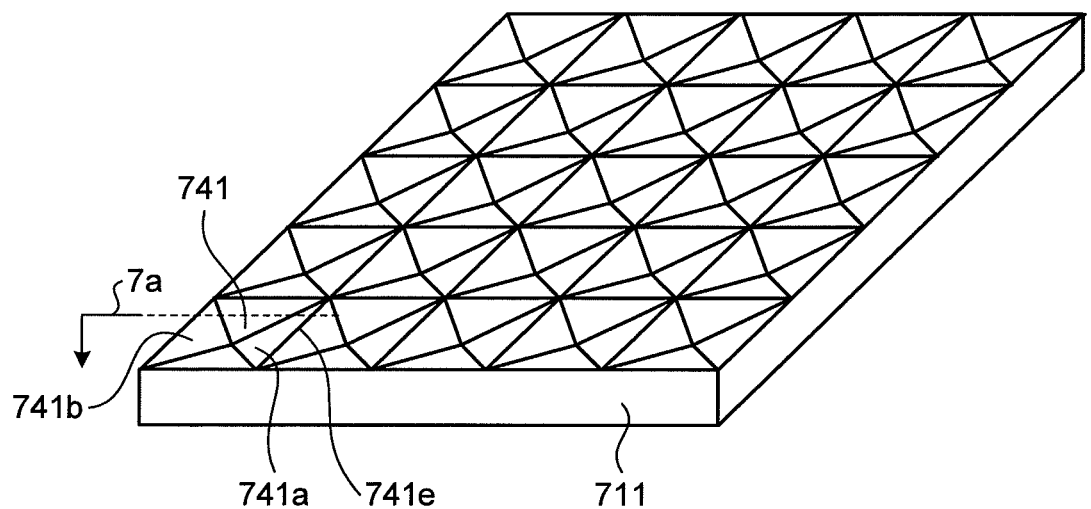
FIG. 7 is a schematic perspective view illustrating another example of the concavo-convex shape of the concavo-convex structure layer in the planar light source device of the present invention.

In the specific examples described above, the concavo-convex structure portions have convex shapes. However, the concavo-convex structure portions in the present invention may have concave shapes. For example, as shown in FIG. 7, concave quadrangular pyramid-shaped portions 741 with square bottoms may be arranged without gaps therebetween. The concave pyramid-shape is not limited to the exemplary shape shown in FIG. 7, and any of concave triangular, pentagonal, hexagonal pyramid-shaped portions and concave quadrangular pyramid-shaped portions with non-square bottoms may be arranged without gaps therebetween or with flat spacing portions therebetween. The concave structure used as the concavo-convex structure is more advantageous than a convex structure in that, for example, the apexes and other portions of the concavo-convex structure are prevented from being chipped by external impact.

Figure 8:
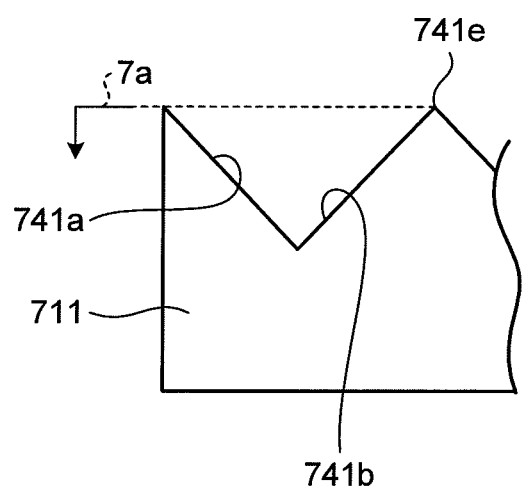
FIG. 8 is a schematic cross-sectional view illustrating a part of the concavo-convex shape shown in FIG. 7.
Figure 9:
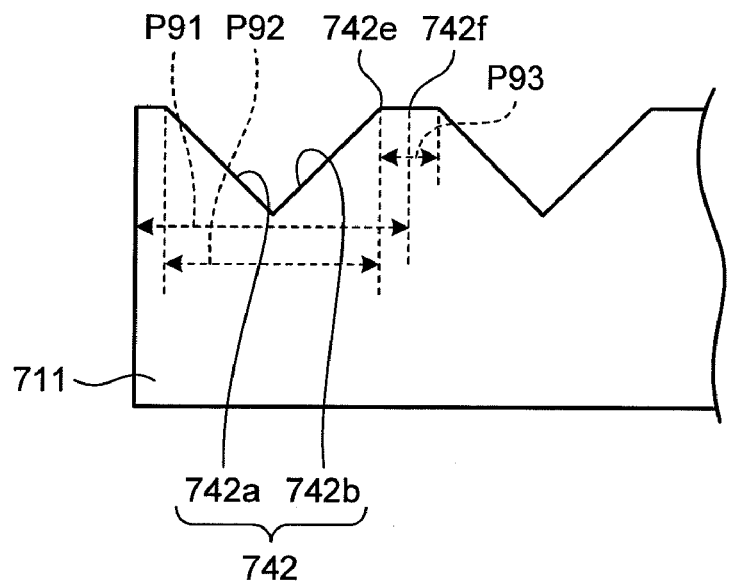
FIG. 9 is a schematic cross-sectional view illustrating another example of the concavo-convex shape of the concavo-convex structure layer in the planar light source device of the present invention.

FIG. 8 is a partial cross-sectional view obtained by cutting the concave quadrangular pyramid 741 in FIG. 7 along a plane that includes a line 7a and is parallel to the normals to inclined surfaces 741a and 741b of the quadrangular pyramid 741 and perpendicular to the direction of the surface of the substrate. In the example in FIG. 7, a base edge 741e of a quadrangular pyramid 741 is in contact with a base edge of an adjacent quadrangular pyramid, and these quadrangular pyramids share a single base edge. However, as shown in FIG. 9, a quadrangular pyramid 742 including inclined surfaces 742a and 742b may have a base edge 742e spaced apart from adjacent quadrangular pyramids, and a flat spacing portion 742f may be formed between these quadrangular pyramids. Such flat spacing portions may be provided so as to extend in two or more directions, as in a spacing portion 742g shown in FIG. 10 that extends in the longitudinal and transverse directions of the surface of the concavo-convex structure layer. Alternatively, the flat spacing portions may be provided so as to extend only in one direction, as in a spacing portion 742h shown in FIG. 11 that extends in one direction on the surface of the concavo-convex structure layer. When such flat portions are provided on the surface in a certain ratio so as not to impair the optical effects of the concavo-convex structure layer, the abrasion resistance of the concavo-convex structure layer can be improved, and the formation of the concavo-convex structure layer can be facilitated.

No particular limitation is imposed on the dimensions of the concavo-convex structure of the concavo-convex structure layer. The maximum value (Ra(max)) of the center line average roughness measured in various directions on the surface having the concavo-convex structure portions formed thereon may be in the range of 1 to 50 μm.

Figure 3:
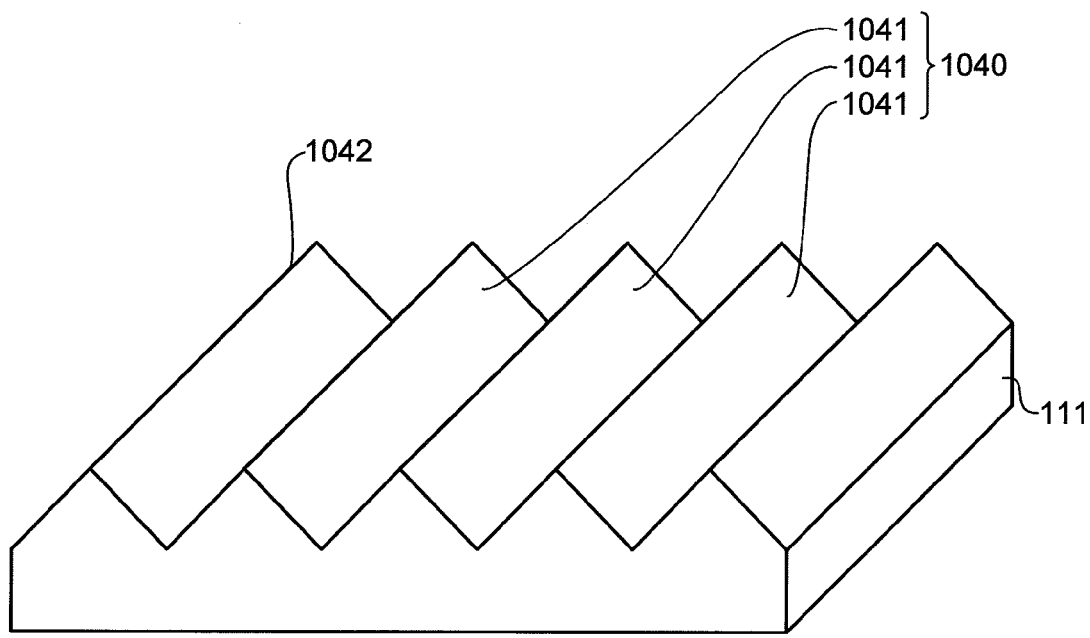
FIG. 3 is a schematic perspective view illustrating another example of the concavo-convex shape of the concavo-convex structure layer in the planar light source device of the present invention.

The concavo-convex structure portions 111E constituting the concavo-convex structure layer 110 may have a prism shape. In this case, prisms such as triangular prisms are arranged such that their height direction is parallel to the light emitting surface. For example, as shown in FIG. 3, a plurality of linear prisms 1041 are arranged parallel to each other and form a linear prism set 1040, but the present invention is not limited thereto. For example, the apex 1042 of a prism may have, instead of a sharp shape, a rounded shape or a flat truncated shape, as in the pyramids described above.

In the present invention, no particular limitation is imposed on the thickness of the concavo-convex structure layer. However, the thickness is preferably 1 to 100 μm. The thickness of the concavo-convex structure layer is the distance between the apexes of the concavo-convex structure portions and a substrate-side surface on which the concavo-convex structure portions are not formed.

In the present invention, the angle formed by an inclined surface of the cone, pyramid, or prism shape and the light emitting surface may be 40 to 70° and preferably 45 to 60°. For example, when the concavo-convex structure is formed of the quadrangular pyramids shown in FIG. 2, it is preferable that their apex angle (angle 1151 in FIG. 4) be 60 to 90°. In order to minimize the change in color tone at different viewing angles and in order to improve the light extraction efficiency, the larger the angle between the light emitting surface and the inclined surfaces, the more preferable. More specifically, the angle is preferably, for example, 55° or more and more preferably 60° or more. In such a case, the upper limit of the angle may be about 70°, in consideration of maintaining the durability of the concavo-convex structure layer.

When the angle between the light emitting surface and the inclined surfaces is 55° or more, the cone, pyramid, or prism shape may have a apex angle of 70° or less.

When the apexes in the concavo-convex structure have a rounded or flat truncated shape, the angularly inclined surfaces except for the rounded or truncated portions are defined as the inclined surfaces of the pyramid or prism shape. For example, in the examples shown in FIGS. 5 and 6, flat surfaces 1241a, 1241b, 1341a, and 1341b are defined as the inclined surfaces of the pyramids. By setting the angle of the inclined surfaces to the aforementioned angle, the light extraction efficiency can be improved. All of the angles of the inclined surfaces on the light emitting surface of the concavo-convex structure layer are not necessarily the same, and inclined surfaces having different inclination angles within the aforementioned range may coexist. The angle between the light emitting surface and the inclined surface of a cone shape may be the angle between the light emitting surface and the generating line of the cone.

The resin composition for forming the concavo-convex structure layer contains a transparent resin and particles.

No particular limitation is imposed on the material of the transparent resin contained in the resin composition. Any of various resins may be used so long as it can form the transparent concavo-convex structure layer and allows the particles to be dispersed therein. Examples of the resin may include thermoplastic resins, thermosetting resins, ultraviolet ray-curable resins, and electron ray-curable resins. Of these, thermoplastic resins can be easily deformed by heat, and ultraviolet ray-curable resins have high curability and high efficiency. Therefore, these resins are preferred because the concavo-convex structure layer can be efficiently formed. Examples of the thermoplastic resins may include polyester-, polyacrylate-, and cycloolefin polymer-based resins. Examples of the ultraviolet ray-curable resins may include epoxy-, acrylic-, urethane-, ene/thiol-, and isocyanate-based resins. Among the aforementioned resins, those having a plurality of polymerizable functional groups may be preferably used.

When the concavo-convex structure layer is formed on a transparent substrate as in the aforementioned embodiment, it is preferable that the refractive index of the substrate be close to the refractive index of the transparent resin as much as possible. The difference in refractive index is preferably 0.1 or less and more preferably 0.05 or less.

The particles contained in the resin composition may be transparent or opaque. A metal, a metal compound, a resin, or the like may be used as the material for the particles. Examples of the metal compound may include metal oxides and metal nitrides. Specific examples of the metal and the metal compound may include high reflectivity metals such as silver and aluminum and metal compounds such as silicon oxide, aluminum oxide, zirconium oxide, silicon nitride, tin-doped indium oxide, and titanium oxide. Examples of the resin may include polymethyl methacrylate and polyurethane.

The shape of the particles may be any of spherical, cylindrical, cubic, rectangular prism, pyramid, cone, and star-like shapes.

The ratio of the amount of the particles in the resin composition is preferably 1 to 40 wt % and more preferably 2 to 20 wt % based on the total amount of the resin composition. By using the particles in an amount equal to or greater than the aforementioned lower limit, the desired effects such as the reduction in the change in color tone at different viewing angles can be obtained. By using the particles in an amount equal to or less than the aforementioned upper limit, the aggregation of the particles in the concavo-convex structure layer can be prevented, and a concavo-convex structure layer containing the particles preferably dispersed therein can be obtained.

The diameter of the particles is 0.1 µm or more and 10 µm or less and preferably 5 µm or less. The "diameter" is a 50% particle diameter in a cumulative distribution in which the cumulative number of particles is plotted with the volumetric particle diameter on the horizontal axis. The larger the particle diameter, the larger the ratio of the amount of the particles necessary to obtain the desired effects. The smaller the particle diameter, the smaller the necessary amount of the particles. Therefore, as the particle diameter decreases, the desired effects such as the reduction in the change in color tone at different viewing angles can be obtained by using a smaller amount of the particles. When the shapes of the particles are not spherical, the diameters of spheres having the same volumes as those of the particles are used as the particle diameters.

The ratio of the amount of particles in unit area of the concavo-convex structure layer is preferably $2 \times 10^3$ to $6 \times 10^{10}$ particles/cm$^2$ and more preferably $8 \times 10^4$ to $1.5 \times 10^{10}$ particles/cm$^2$. By setting the ratio of the amount of the particles in the aforementioned range, the desired effects such as the reduction in the change in color tone at different viewing angles can be obtained.

When the particles are transparent, the difference in refractive index between the particles and the transparent resin is 0.05 to 0.5 and preferably 0.07 to 0.5. Although the refractive index of the particles may be greater or smaller than that of the transparent resin, it is preferable that the particles have a greater refractive index than the transparent resin because thereby an inorganic or metal material having a relatively high refractive index can be preferably used with the transparent resin which usually has the refractive index in the range of about 1.5 to about 1.6. Examples of the particles having a refractive index of 1.5 or less may include hollow particles and porous particles (1.3 to 1.4). When the difference in refractive index between the particle and the transparent resin is too small, scattering effects are not obtained. Although the light extraction effects are improved, color unevenness is not suppressed. When the difference is too large, the degree of scattering increases, so that the color unevenness is suppressed. However, the light extraction effects deteriorate.

If necessary, the resin composition may contain, in addition to the transparent resin and the particles, additional components. Examples of the additional components may include additives such as phenol-based, amine-based, and other anti-degradants, surfactant-based, siloxane-based and other anti-static agents, and triazole-based, 2-hydroxybenzophenone-based, and other light-proofing agents.

Generally, an organic EL element is produced by forming, on a substrate, electrodes, a luminescent layer, and other layers constituting the element and providing a sealing member that covers these layers, so that the layers such as the luminescent layer are sealed with the substrate and the sealing member. Generally, a device that emits light from its substrate side is referred to as a bottom emission device, and a device that emits light from its sealing member side is referred to as a top emission device. The planar light source device of the present invention may be any of the top and bottom emission devices. When the planar light source device is of the bottom emission type, the concavo-convex structure layer is disposed on the side of the substrate which is for forming the aforementioned layers. When the planar light source device is of the top emission type, a structural member, such as the sealing member, on the light emitting surface side is used as a substrate, and the concavo-convex structure layer is disposed on this substrate.

In the present invention, examples of the material for forming the substrate on the light emitting surface side may include glass and resin. No particular limitation is imposed on the refractive index of the substrate on the light emitting surface side, and the refractive index may be 1.5 to 1.6. In the present invention, no particular limitation is imposed on the thickness of the substrate, but the thickness is preferably 0.1 to 5 mm.

In the example shown in FIG. 1, the substrate 101 is in direct contact with the transparent resin layer 111. However, another layer may be interposed therebetween so long as the effects of the present invention are not impaired. For example, when the planar light source device of the present invention is manufactured according to an embodiment of the manufacturing method described later, a transparent film such as a PET film may be interposed between the substrate 101 and the transparent resin layer 111.

In the present invention, no particular limitation is imposed on the luminescent layer included in the element, and any of known luminescent layers may be suitably selected. For adaptation to a light source, the luminescent layer may be a single layer or a combination of a plurality of layers so that white light or light of a color close to white is generated. No particular limitation is imposed on the electrodes, and any of known electrodes may be suitably selected. In addition to the luminescent layer, other layers such as a hole injection layer, a hole transport layer, an electron transport layer, an electron injection layer, and a gas barrier layer may be disposed between the electrodes.

No particular limitation is imposed on the materials for the electrodes and for the layers disposed therebetween. Specific examples of such materials are as follows.

Examples of the material for the transparent electrode may include ITO.

Examples of the material for the hole injection layer may include starburst-type aromatic diamine compounds.

Examples of the material for the hole transport layer may include triphenyldiamine derivatives.

Similarly, examples of the host material of a yellow luminescent layer may include triphenyldiamine derivatives, and examples of the dopant material of the yellow luminescent layer may include tetracene derivatives.

Examples of the material for a green luminescent layer may include pyrazoline derivatives.

Examples of the host material of a blue luminescent layer may include anthracene derivatives, and examples of the dopant material of the blue luminescent layer may include perylene derivatives.

Examples of the material for a red luminescent layer may include europium complexes.

Examples of the material for the electron transport layer may include aluminum quinoline complexes (Alq).

Examples of the material for a cathode may include a stack of lithium fluoride and aluminum layers that is produced by sequentially depositing these layers by vacuum deposition.

A stacked or tandem luminescent layer that generates complementary colors can be obtained by suitably combining any of the aforementioned luminescent layers and other luminescent layers. The combination of complementary colors may be yellow-blue, green-blue-red, or the like.

In the planar light source device configured as described above, variations in at least one of x- and y-chromaticity coordinates in any directions in a hemisphere on the light emitting surface can be adjusted within ±0.1. Moreover, variations in both the x- and y-chromaticity coordinates can be adjusted within ±0.1. Therefore, in the planar light source device (organic EL lighting device), a change in color tone at different viewing angles can be suppressed. The variations in chromaticity in all the directions in the hemisphere may be measured by, for example, the following procedure: a spectral radiance meter is placed so as to be aligned in a normal direction (a front direction) with respect to the luminescent surface of the organic EL lighting device, and a mechanism for rotating the luminescent surface from −90 to 90° with respect to the direction of the normal being defined as 0° is provided. In this manner, the emission spectra can be measured in various directions to compute the chromaticity coordinates, and the variations in the chromaticity coordinates can thereby be computed.

No particular limitation is imposed on the method of manufacturing the planar light source device of the present invention. The planar light source device may be manufactured by providing a flat layer of the resin composition on a substrate and shaping the flat layer into a predetermined concavo-convex structure (hereinafter this method is referred to as method 1) or by forming a concavo-convex structure layer by shaping the resin composition and bonding the formed concavo-convex structure layer to a substrate on the light emitting surface side (hereinafter this method is referred to as method 2).

In the method 1 described above, the step of shaping the flat layer of the resin composition into the concavo-convex structure may be performed by pressing a mold having a predetermined structure against the resin composition layer. Preferably, a heated mold having the concavo-convex structure is pressed against the resin composition layer. More specifically, for example, a thermoplastic resin is used as the transparent resin for forming the resin composition, and a mold having the concavo-convex structure, which has been heated to a temperature equal to or higher than the glass transition temperature of the transparent resin, is pressed against the resin composition layer. When the transparent resin is a resin curable with energy rays such as ultraviolet rays, the mold is pressed against the transparent resin layer, and then the transparent resin is cured by irradiation with energy rays. In this manner, the favorable concavo-convex structure can be molded, and can be easily released from the mold.

In the method 2 described above, for example, the resin composition layer is formed on a layer other than the substrate and shaped into a predetermined concavo-convex structure. Then the shaped resin composition layer with the aforementioned layer or the resin composition layer removed therefrom is bonded to the substrate on the light emitting surface side. For example, a transparent film such as a PET film may be used as the aforementioned layer other than the substrate. The resin composition layer formed on such a film may be shaped into the predetermined concavo-convex structure by the same procedure as in method 1. The shaped resin composition layer may be bonded to the surface on the light emitting surface side of the substrate used as the substrate of the planar light source device on the light emitting surface side, to obtain a stack having the substrate, the transparent film, and the concavo-convex structure layer stacked in that order.

Alternatively a stack of the substrate and the concavo-convex structure layer may also be obtained in the following manner. After the concavo-convex structure layer is formed on a transparent or non-transparent film, plate, or the like, the concavo-convex structure layer may be removed from the film or the like, which may then be bonded to the surface on the light emitting surface side of the substrate used as the substrate of the planar light source device on the light emitting surface side.

As a further alternative, the concavo-convex structure layer may also be obtained by injecting a liquid resin composition into a mold having the concavo-convex structure and curing the resin composition. This concavo-convex structure layer may be bonded to the surface on the light emitting surface side of the substrate used as the substrate of the planar light source device on the light emitting surface side, whereby a stack of the substrate and the concavo-convex structure layer is obtainable.

After the concavo-convex structure layer is obtained using any of the methods 1 and 2 described above, constituent elements such as electrodes and a luminescent layer are provided on the surface opposite to the light emitting surface of the substrate, so that a planar light source device can be thereby obtained.

No particular limitation is imposed on use of the planar light source device of the present invention. The planar light source device may be used as a light source of a lightning device and a backlight unit for a display device such as a liquid-crystal display device.

The present invention is not limited to the aforementioned exemplary embodiment, and modifications may be made within the scope of the claims of the application and the scope of equivalents thereto.

For example, the substrate may be in direct contact with the concavo-convex structure layer, but another layer such as a bonding layer may be disposed therebetween in order to improve their contact characteristics. In this case, a transparent adhesive having a refractive index close to those of the substrate and the transparent resin layer may be suitably used. In the aforementioned exemplary embodiment, the description has been given mainly of the case in which the substrate and the transparent resin layer are provided as separate members. When the substrate and the transparent resin layer are formed of the same material, these may be formed as an integrated continuous member.

EXAMPLES

Hereinafter, the present invention will be described in more detail by way of Examples. However, the present invention is not limited to the Examples described below.

Example 1

Spherical $SiO_2$ particles (n=1.43) having a diameter of 2 µm were added to a UV (ultraviolet ray) curable urethane acrylic resin (refractive index after curing: n=1.53) in an amount of 3 wt % based on the total amount of the composition. The mixture was stirred to disperse the particles, and a resin composition was thereby obtained.

The obtained resin composition was applied to a glass substrate to a thickness of 100 µm. Then a metal mold having a predetermined shape was pressed against the resin composition, and the resin composition was irradiated through the glass substrate with UV rays at an accumulated light quantity of 1,000 mJ/cm$^2$ to form a concavo-convex structure layer on the substrate. In this concavo-convex structure, quadrangular pyramids each having a square bottom shape of 50 µm side and a apex angle of 90° were arranged without gaps therebetween. The angle between the light emitting surface and the inclined surfaces of the quadrangular pyramids was 45°. The thickness of the concavo-convex structure layer was 115 µm.

A transparent electrode layer (100 nm), a hole transport layer (10 nm), a yellow luminescent layer (20 nm), a blue luminescent layer (15 nm), an electron transport layer (15 nm), an electron injection layer (1 nm), and a reflecting electrode layer (100 nm) were formed in that order on a surface of the obtained substrate opposite to the surface on which the concavo-convex structure layer was disposed. All the layers from the hole transport layer to the electron transport layer were formed of organic materials. The yellow and blue luminescent layers had different emission spectra.

The materials used for forming the layers from the transparent electrode layer to the reflecting electrode layer were as follows.

Transparent electrode layer: tin-doped indium oxide (ITO)
Hole transport layer: 4,4'-bis[N-(naphthyl)-N-phenylamino]biphenyl (α-NPD)
Yellow luminescent layer: α-NPD containing 1.5 wt % of rubrene
Blue luminescent layer: 4,4'-dicarbazolyl-1,1'-biphenyl (CBP) containing 10 wt % of iridium complex
Electron transport layer: phenanthroline derivative (BCP)
Electron injection layer: lithium fluoride (LiF)
Reflecting electrode layer: Al The transparent electrode layer was formed by reactive sputtering with an ITO target, and the surface resistance was 10 Ω/square or less. To form the layers from the hole injection layer to the reflecting electrode layer, the glass substrate having the transparent electrode layer formed thereon was placed in a vacuum deposition apparatus, and the materials for the layers from the hole injection layer to the reflecting electrode layer were successively deposited by resistance heating. The inner pressure of the system was $5 \times 10^{-3}$ Pa, and the evaporation rates were 0.1 to 0.2 nm/s.

Wiring leads for applying voltage were attached to the electrode layers. The layers from the hole transport layer to the reflecting electrode layer were sealed with a sealing member, and a planar light source device was thereby produced. When electric power was applied to the device to emit light, the light coming out of the glass substrate was white light.

The produced planar light source device was evaluated as follows. A spectral radiance meter (BM-7, TOPCON Corporation) was placed so as to be aligned in a front direction (a normal direction) with respect to the luminescent surface, and a constant current of 100 mA/m$^2$ was applied. The luminescent surface was rotated to change the direction of the spectral radiance meter relative to the luminescent surface. The direction was changed in the range of −90 to 90° with respect to the front direction (normal direction) being defined as 0° in a direction parallel to one of the bottom edges of the quadrangular pyramid. The intensity of the emitted light and the emission spectrum were measured every 5° in the angle range of −90 to 90° to compute external quantum efficiency. The chromaticity coordinates when observation was made in the front direction (0°) were measured, and the chromaticity coordinates when observation was made in a direction inclined 45° with respect to the front direction toward a direction parallel to one of the bottom edges of the quadrangular pyramid were measured. The results are shown in Table 1.

The changes in the x and y coordinates between the front direction (0°) and 45° direction were measured. The results showed that the change in the x-coordinate was 0.02 and the change in the y-coordinate was 0.03.

Comparative Example 1

A planar light source device was produced and evaluated by the same procedure as in Example 1 except that only a UV curable urethane acrylic resin not containing particles was used instead the resin composition for forming the concavo-convex structure layer. The results are shown in Table 1. The changes in the x and y coordinates between the front direction (0°) and 45° direction were 0.13 and 0.04, respectively.

Comparative Example 2

A planar light source device was produced and evaluated by the same procedure as in Example 1 except that, in the resin composition for forming the concavo-convex structure layer, $SiO_2$ particles having a diameter of 30 μm was used. The results are shown in Table 1. The changes in the x and y coordinates between the front direction (0°) and 45° direction were 0.01 and 0.11, respectively.

Comparative Example 3

A planar light source device was produced and evaluated by the same procedure as in Example 1 except that the amount of the $SiO_2$ particles contained in the resin composition for forming the concavo-convex structure layer was changed to 50 wt %. The results are shown in Table 1. The changes in the x and y coordinates between the front direction (0°) and 45° direction were 0.11 and 0.01, respectively.

Comparative Example 4

A planar light source device was produced and evaluated by the same procedure as in Example 1 except that the amount of the $SiO_2$ particles contained in the resin composition for forming the concavo-convex structure layer was changed to 0.5 wt %. The results are shown in Table 1. The changes in the x and y coordinates between the front direction (0°) and 45° direction were 0.11 and 0.04, respectively.

Comparative Example 5

A planar light source device was produced and evaluated by the same procedure as in Example 1 except that a resin composition containing, instead of the $SiO_2$ particles, $TiO_2$ particles (n=2.3) in an amount of 3 wt % based on the total amount of the composition was used as the resin composition for forming the concavo-convex structure layer. The results are shown in Table 1. The changes in the x and y coordinates between the front direction (0°) and 45° direction were 0.12 and 0.12, respectively.

Comparative Example 6

A planar light source device was produced and evaluated by the same procedure as in Example 1 except that a resin composition containing, instead of the $SiO_2$ particles, polymethyl methacrylate particles (n=1.49) in an amount of 3 wt % based on the total amount of the composition was used as the resin composition for forming the concavo-convex structure layer. The results are shown in Table 1. The changes in the x and y coordinates between the front direction (0°) and 45° direction were 0.12 and 0.12, respectively.

TABLE 1

| | Brightness in the front direction (cd/m$^2$) | External quantum efficiency (%) | Chromaticity coordinate (0°) | Chromaticity coordinate (45°) |
|---|---|---|---|---|
| Exampl 1 | 2300 | 5.0 | (0.33, 0.33) | (0.35, 0.36) |
| Comparative Exampl 1 | 1200 | 2.5 | (0.35, 0.36) | (0.48, 0.42) |
| Comparative Exampl 2 | 1300 | 2.7 | (0.34, 0.36) | (0.45, 0.37) |
| Comparative Exampl 3 | 1350 | 2.8 | (0.34, 0.35) | (0.45, 0.36) |
| Comparative Exampl 4 | 1400 | 3.0 | (0.35, 0.36) | (0.46, 0.40) |
| Comparative Exampl 5 | 1500 | 3.3 | (0.33, 0.34) | (0.45, 0.46) |
| Comparative Exampl 6 | 1450 | 3.1 | (0.33, 0.34) | (0.45, 0.46) |

As is clear from the results shown in Table 1, in Example 1 in which the concavo-convex structure layer satisfies the requirements of the present invention, the brightness in the front direction and the external quantum efficiency are better than those in Comparative Examples 1 to 5 in which any of the requirements is outside the range defined in the present invention. In addition, the change in color tone between when the observation was made in the front direction and when the observation was made in a direction inclined relative to the front direction was small.

Example 2-1

2-1-1: Concavo-Convex Structure Layer

Spherical $SiO_2$ particles (n=1.43) having a diameter of 2 μm were added to a UV (ultraviolet ray) curable urethane acrylic resin (refractive index after curing: n=1.53) in an amount of 3 wt % based on the total amount of the composition. The mixture was stirred to disperse the particles, and a resin composition was thereby obtained.

The obtained resin composition was applied to a transparent film (product name "ZEONOR Film," product of ZEON Corporation, thickness: 180 μm) to a thickness of 100 μm. Then a metal mold having a predetermined shape was pressed against the resin composition, and the resin composition was irradiated through the transparent film with UV rays at an accumulated light quantity of 5,000 mJ/cm$^2$ to form a concavo-convex structure layer on the transparent film, whereby a layered stack having a layer structure of (the transparent film)-(the concavo-convex structure layer) was obtained. In the concavo-convex structure of this concavo-convex structure layer, quadrangular pyramids each having a square bottom shape of 50 μm side and a apex angle of 90° were arranged without gaps therebetween. The angle between the light emitting surface and the inclined surfaces of the quadrangular pyramids was 45°. The thickness of the concavo-convex structure layer was 115 μm.

2-1-2: Luminescent Element

A transparent electrode layer, a hole transport layer, a yellow luminescent layer, a blue luminescent layer, an electron transport layer, an electron injection layer, and a reflecting electrode layer were formed on one surface of a glass substrate.

The materials used for forming the layers from the transparent electrode layer to the reflecting electrode layer were as follows.

Transparent electrode layer: tin-doped indium oxide (ITO)
Hole transport layer: 4,4'-bis[N-(naphthyl)-N-phenylamino]biphenyl (α-NPD)
Yellow luminescent layer: α-NPD containing 1.5 wt % of rubrene
Blue luminescent layer: 4,4'-dicarbazolyl-1,1'-biphenyl (CBP) containing 10 wt % of iridium complex
Electron transport layer: phenanthroline derivative (BCP)
Electron injection layer: lithium fluoride (LiF)
Reflecting electrode layer: Al
Wiring leads for applying voltage were attached to the electrode layers, and the layers from the hole transport layer to the reflecting electrode layer were sealed with a sealing member, and a luminescent element was thereby produced.

2-1-3: Planar Light Source Device

The surface of the stack on the transparent film side obtained in (2-1-1) was bonded to the surface of the luminescent element on the glass substrate side obtained in (2-1-2) via an adhesive layer (thickness: 25 μm, an acrylic-based adhesive) to produce a planar light source device.

Figure 14:
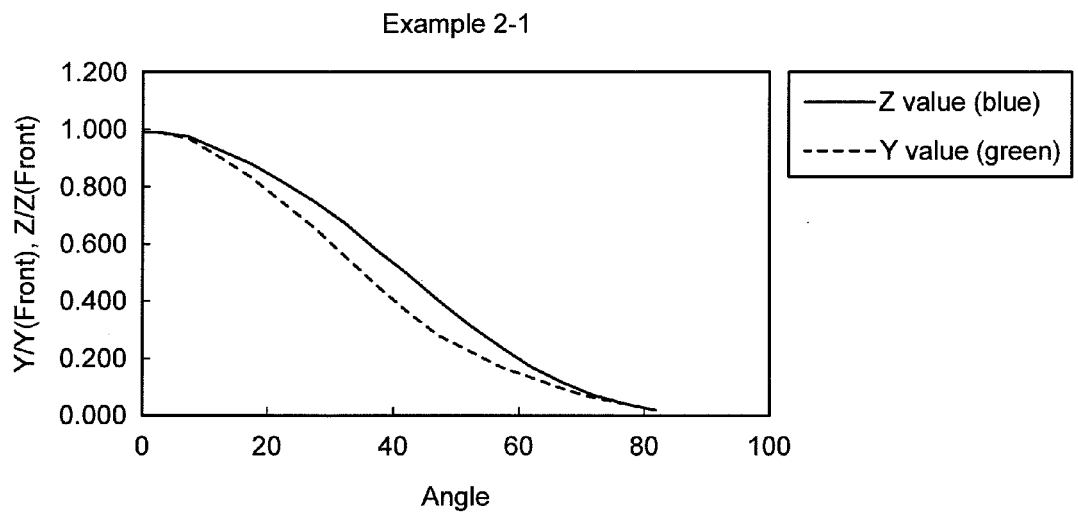
FIG. 14 is a graph showing the measurement results of the relationship between measurement angle and Y/Y (front direction) and Z/Z (front direction) in Example 2-1 of the present application.

A constant current of 100 mA/m$^2$ was applied to the planar light source device to measure Z value (blue) and Y value (green) of the tristimulus values. The measurement was performed for each polar angle using Imaging Sphere (product of Radiant Imaging Corporation). Then standardized values (Y/Y (front direction) and Z/Z (front direction)), with respect to the front direction value being defined as 1, were determined to obtain light distribution characteristics of blue and green colors. The light distribution characteristics of the Y value correspond to the angular distribution of the luminous intensity. The results are shown in FIG. 14. The direction is a value in the range of 0 to 100°, with respect to the front direction (normal direction) being defined as 0°, toward a direction parallel to one of the bottom edges of the quadrangular pyramid.

Example 2-2

2-2-1: Concavo-Convex Structure Layer

A layered stack having a layer structure of (the transparent film)-(the concavo-convex structure layer) was obtained by the same procedure as in (2-1-1) of Example (2-1) except that the shape of the metal mold was changed. In the concavo-convex structure of this concavo-convex structure layer, quadrangular pyramid-shaped recesses each having a square bottom shape of 50 μm side and a apex angle of 90° were arranged without gaps therebetween. The angle between the light emitting surface and the inclined surfaces of the quadrangular pyramids was 45°.

2-2-2: Planar Light Source Device

Figure 15:
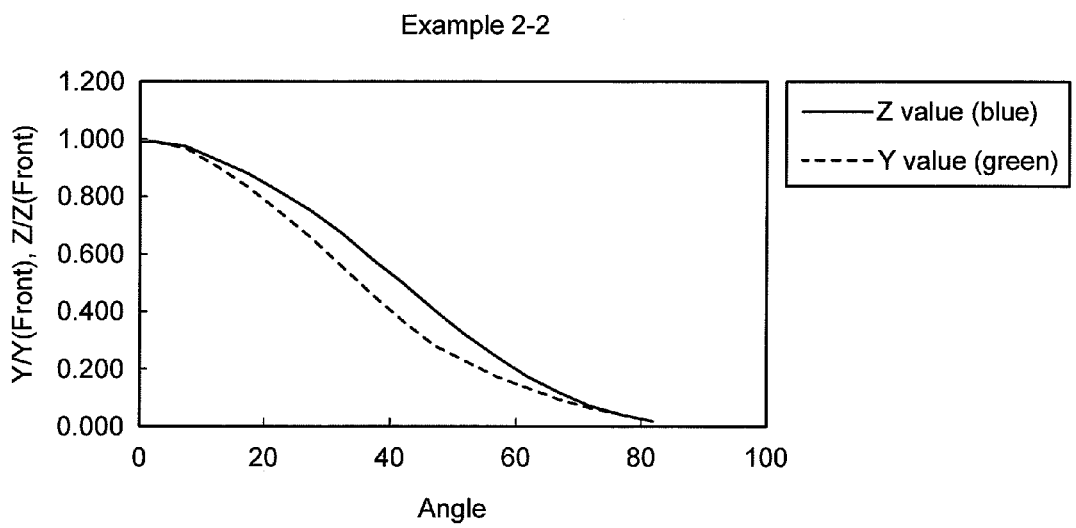
FIG. 15 is a graph showing the measurement results of the relationship between measurement angle and Y/Y (front direction) and Z/Z (front direction) in Example 2-2 of the present application.
Figure 16:
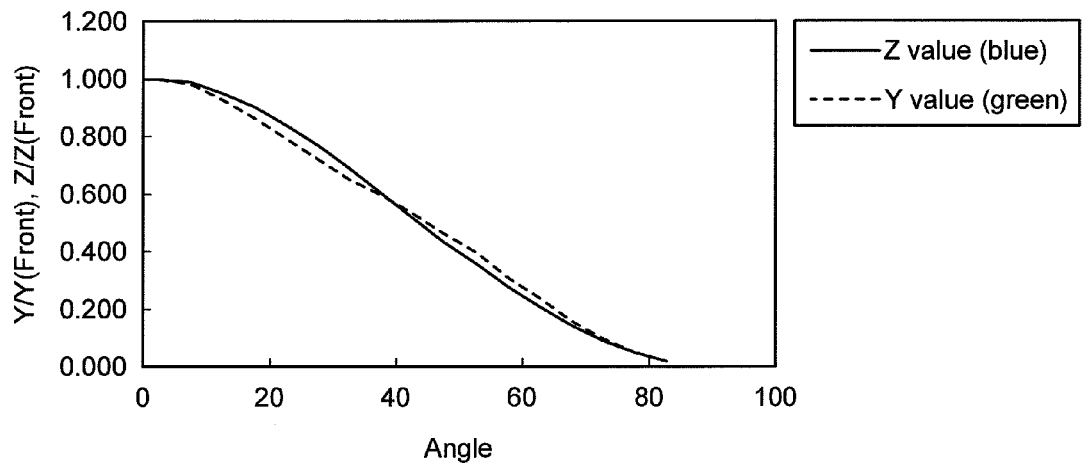
FIG. 16 is a graph showing the measurement results of the relationship between measurement angle and Y/Y (front direction) and Z/Z (front direction) in Example 3-1 of the present application.
Figure 17:
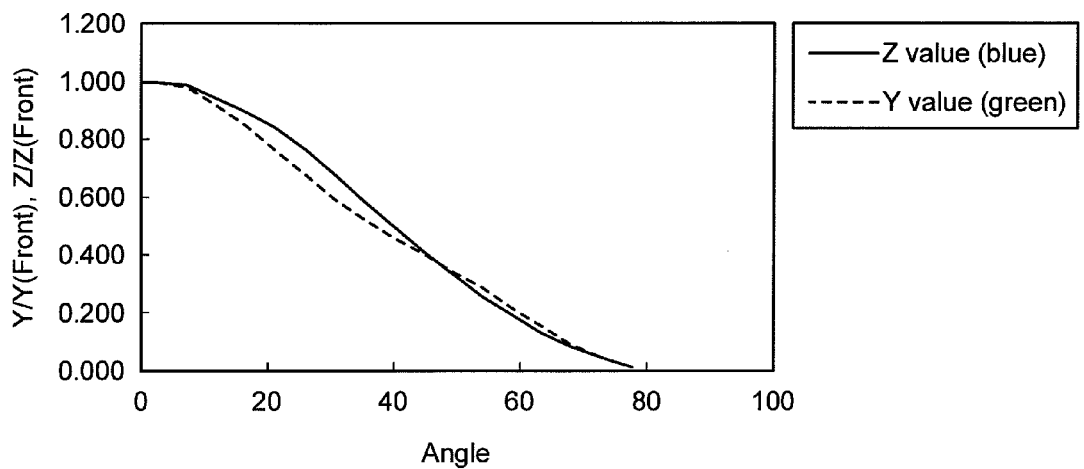
FIG. 17 is a graph showing the measurement results of the relationship between measurement angle and Y/Y (front direction) and Z/Z (front direction) in Example 3-1 of the present application.
Figure 18:
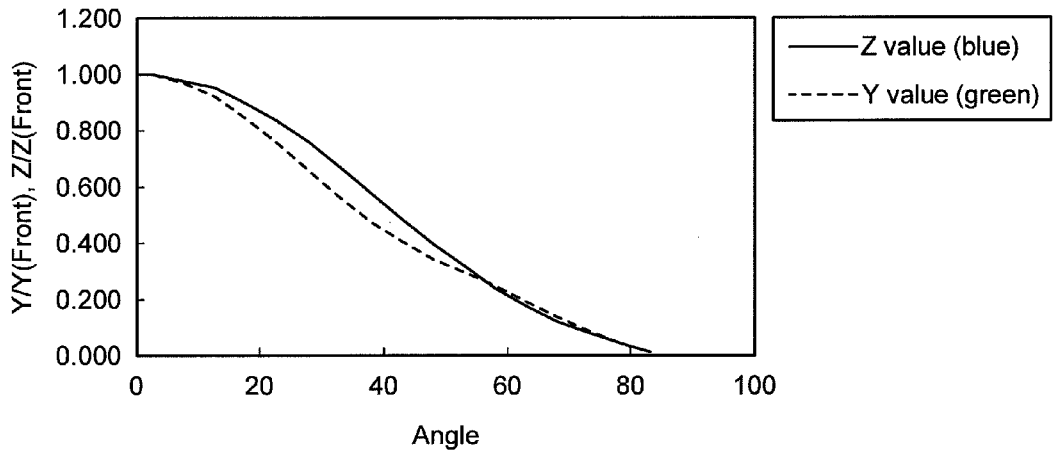
FIG. 18 is a graph showing the measurement results of the relationship between measurement angle and Y/Y (front direction) and Z/Z (front direction) in Example 3-1 of the present application.
Figure 19:
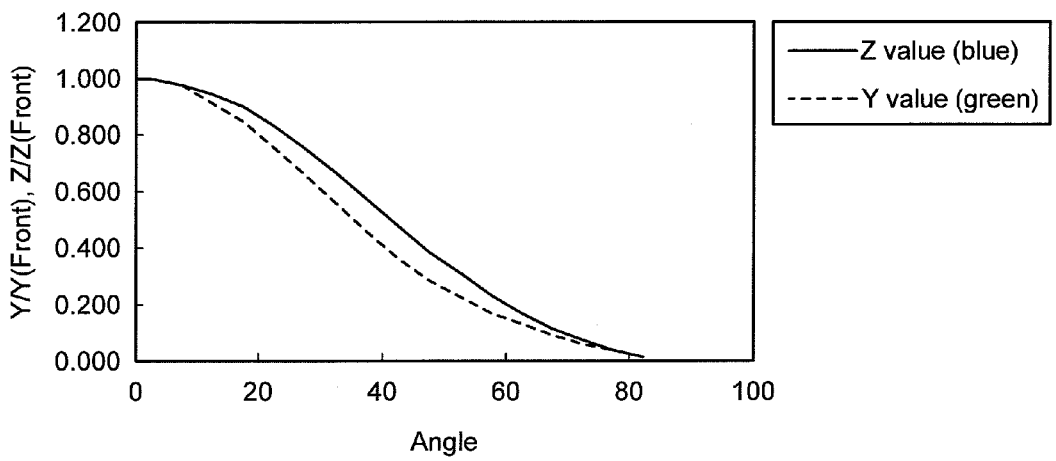
FIG. 19 is a graph showing the measurement results of the relationship between measurement angle and Y/Y (front direction) and Z/Z (front direction) in Example 3-1 of the present application.
Figure 20:
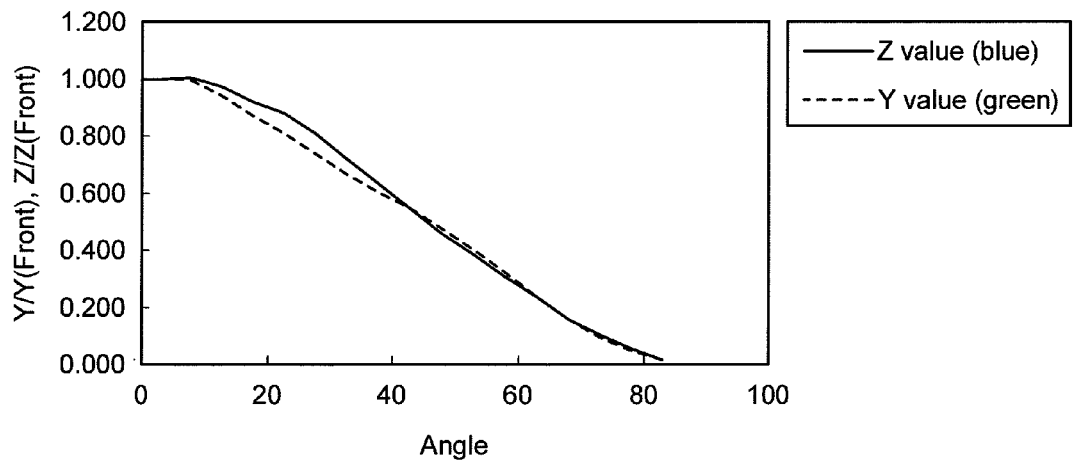
FIG. 20 is a graph showing the measurement results of the relationship between measurement angle and Y/Y (front direction) and Z/Z (front direction) in Example 3-2 of the present application.
Figure 21:
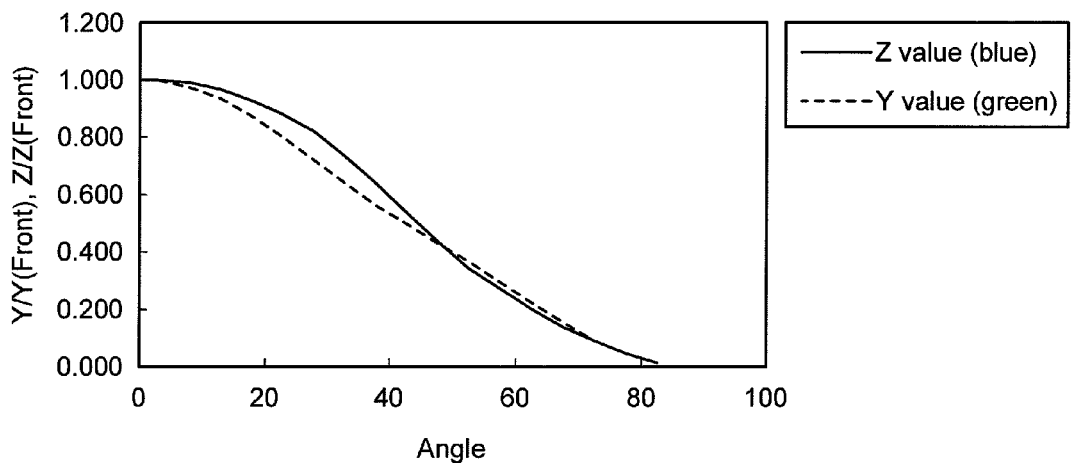
FIG. 21 is a graph showing the measurement results of the relationship between measurement angle and Y/Y (front direction) and Z/Z (front direction) in Example 3-2 of the present application.
Figure 22:
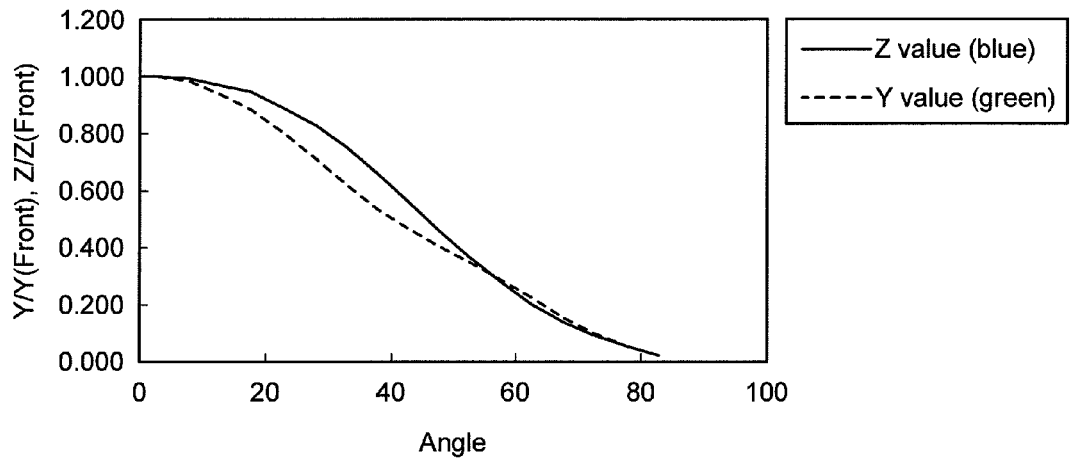
FIG. 22 is a graph showing the measurement results of the relationship between measurement angle and Y/Y (front direction) and Z/Z (front direction) in Example 3-2 of the present application.
Figure 23:
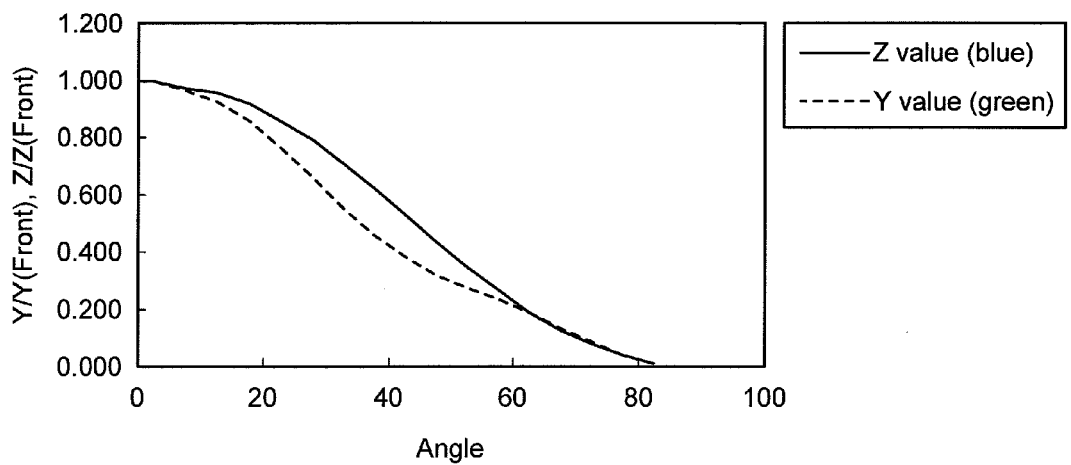
FIG. 23 is a graph showing the measurement results of the relationship between measurement angle and Y/Y (front direction) and Z/Z (front direction) in Example 3-2 of the present application.

A planar light source device was produced and evaluated by the same procedure as in (2-1-2) and (2-1-3) in Example (2-1) except that a stack obtained in (2-2-1) was used instead of the stack obtained in (2-1-1). The results are shown in FIG. 15.

Comparative Example 7

Figure 12:
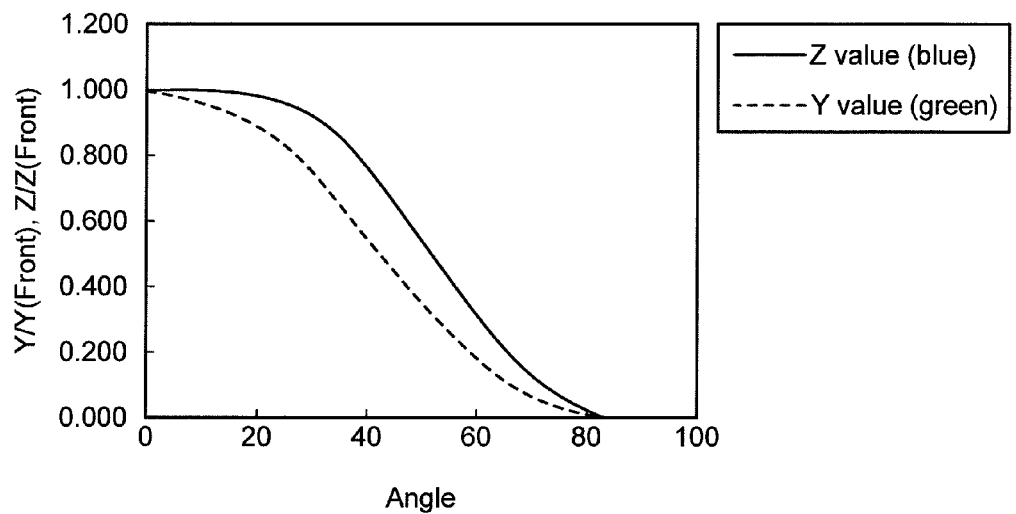
FIG. 12 is a graph showing the measurement results of the relationship between measurement angle and Y/Y (front direction) and Z/Z (front direction) in Comparative Example 7 of the present application.

The light distribution characteristics of the luminescent element obtained in (2-1-2) in Example 2-1 (which did not have the concavo-convex structure layer and the transparent film) was determined as in (2-1-3). The results are shown in FIG. 12.

Comparative Example 8

C8-1: Concavo-Convex Structure Layer

A layered stack having a layer structure of (the transparent film)-(the cured resin composition layer) was obtained by the same procedure as in (2-1-1) in Example (2-1) except that the shape of the metal mold was changed, i.e., a metal mold with no concavo-convex structure was used. The cured resin composition layer had a flat shape with no concaves or convexes.

C8-2: Planar Light Source Device

Figure 13:
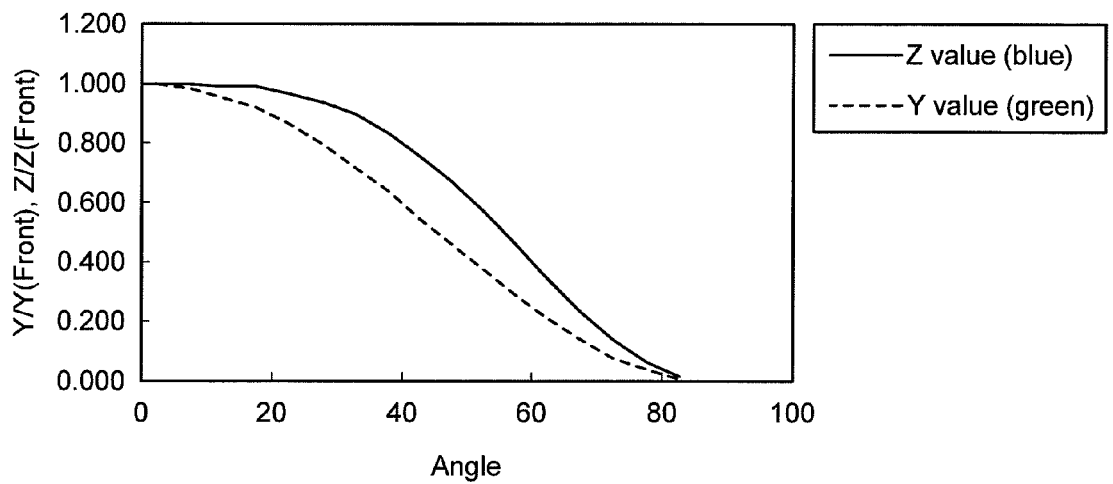
FIG. 13 is a graph showing the measurement results of the relationship between measurement angle and Y/Y (front direction) and Z/Z (front direction) in Comparative Example 8 of the present application.

A planar light source device was produced and evaluated by the same procedure as in (2-1-2) and (2-1-3) in Example (2-1) except that the stack obtained in (C8-1) was used instead of the stack obtained in (2-1-1). The results are shown in FIG. 13.

As can be seen by comparing the results of Examples 2-1 and 2-2 with the results of Comparative Examples 7 and 8, in the planar light source devices of the Comparative Examples, the light distribution characteristics of green color (the light distribution characteristics of the luminous intensity) were significantly different from the light distribution characteristics of blue color, and the planar light source devices were bluish when viewed in an oblique direction. However, in the planar light source devices of the present invention, the difference between the light distribution characteristics of blue color and the light distribution characteristics of green color was small. Therefore, a reduction in the degree of bluishness varying depending on the viewing angle was achieved. In other words, a planar light source device in which a change in color tone at different viewing angles is small can be provided.

The results of Example 2-1 were similar to the results of Example 2-2. The abrasion resistance of the structure of the concavo-convex structure layer in Example 2-2 is better than that of the structure in Example 2-1. Therefore, the planar light source device in Example 2-2 has optical performance equivalent to that of the planar light source device in Example 2-1 and is advantageous in that the abrasion resistance is better.

Example 3-1

3-1-1: Concavo-Convex Structure Layer

Four different layered stacks each having a layer structure of (the transparent film)-(the concavo-convex structure layer) were obtained by the same procedure as in (2-1-1) in Example (2-1) except that four different metal molds having shapes different from the shape of the mold used in Example (2-1) were used. In the concavo-convex structure of each of the concavo-convex structure layers, quadrangular pyramids each having a square bottom shape of 50 μm side and a apex angle of 40°, 50°, 60°, or 70° were arranged without gaps therebetween. The angle between the light emitting surface and the inclined surfaces of the quadrangular pyramids was 70°, 65°, 60°, or 55°.

3-1-2: Planar Light Source Device

Four different planar light source devices were produced and evaluated by the same procedure as in (2-1-2) and (2-1-3)

in Example (2-1) except that the four different stacks obtained in (3-1-1) were used instead of the stack obtained in (2-1-1). The results are shown in FIGS. 16 to 19.

Example 3-2

3-2-1: Concavo-Convex Structure Layer

Layered stacks each having a layer structure of (the transparent film)-(the concavo-convex structure layer) were obtained by the same procedure as in (2-1-1) in Example (2-1) except that the shape of the metal mold was changed. In the concavo-convex structure of each of the concavo-convex structure layers, quadrangular pyramid-shaped recesses each having a square bottom shape of 50 μm side and a apex angle of 40°, 50°, 60°, or 70° were arranged without gaps therebetween. The angle between the light emitting surface and the inclined surfaces of the quadrangular pyramids was 70°, 65°, 60°, or 55°.

3-2-2: Planar Light Source Device

Four different planar light source devices were produced and evaluated by the same procedure as in (2-1-2) and (2-1-3) in Example (2-1) except that the four different stacks obtained in (3-2-1) were used instead of the stack obtained in (2-1-1). The results are shown in FIGS. 20 to 23.

As can be seen by comparing the results of Examples 3-1 and 3-2 with the results of Comparative Examples 7 and 8, in the planar light source devices of the Comparative Examples, the light distribution characteristics of green color (the light distribution characteristics of the luminous intensity) were significantly different from the light distribution characteristics of blue color, and the planar light source devices were bluish when viewed in an oblique direction. However, in the planar light source devices of the present invention, the difference between the light distribution characteristics of blue color and the light distribution characteristics of green color was small. Therefore, a reduction in the degree of bluishness varying depending on the viewing angle was achieved. In other words, a planar light source device in which a change in color tone at different viewing angles is small can be provided.

As can be seen by comparing the results of Examples 3-1 and 3-2 with the results of Examples 2-1 and 2-2, the difference in the light distribution characteristics between blue and green colors decreases as the angle between the light emitting surface and the inclined surfaces of the concavo-convex structure layer increases.

Example 4-1

4-1-1: Concavo-Convex Structure Layer

Two different layered stacks each having a layer structure of (the transparent film)-(the concavo-convex structure layer) were obtained by the same procedure as in (2-1-1) in Example (2-1) except that the shape of the metal mold was changed. In the concavo-convex structure of each of the concavo-convex structure layers, quadrangular pyramids each having a flat truncated apex, a square bottom shape of 50 μm side, and a apex angle of 60° as schematically shown in FIG. 6 were arranged without gaps therebetween. The flat portion formed in the apex of each of the quadrangular pyramids had a square shape, and the side length of the square shape was 0.2 or 0.4 times the pitch of the quadrangular pyramids, i.e., 10 μm or 20 μm.

4-1-2: Planar Light Source Device

Figure 24:
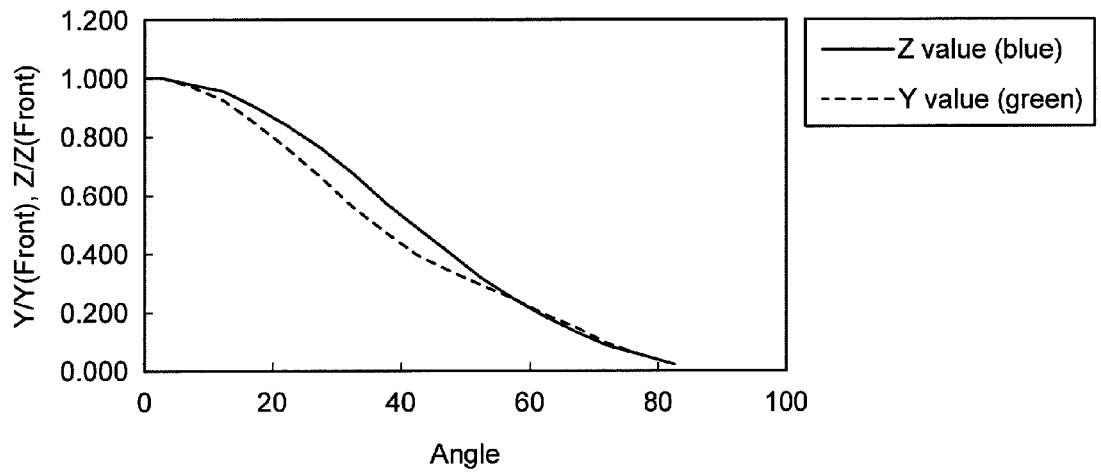
FIG. 24 is a graph showing the measurement results of the relationship between measurement angle and Y/Y (front direction) and Z/Z (front direction) in Example 4-1 of the present application.
Figure 25:
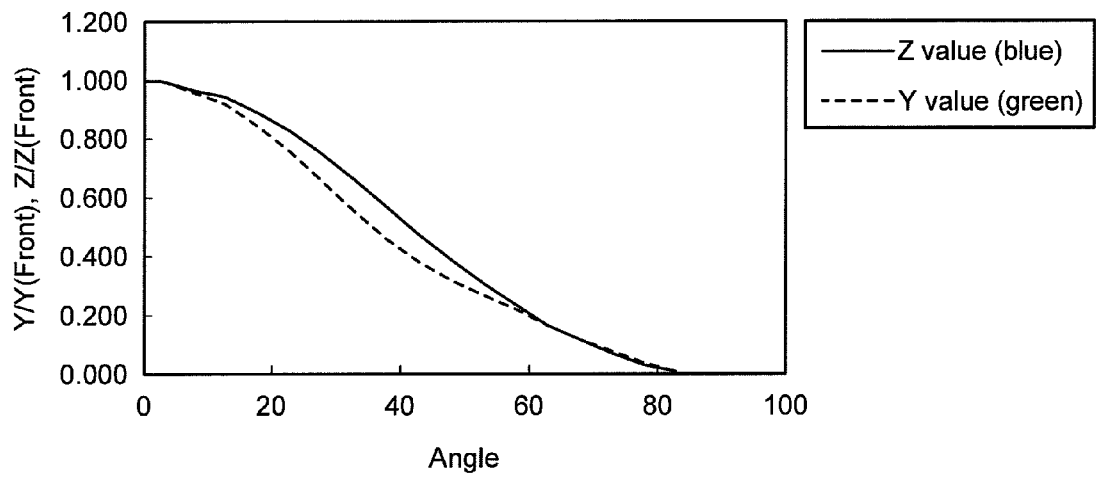
FIG. 25 is a graph showing the measurement results of the relationship between measurement angle and Y/Y (front direction) and Z/Z (front direction) in Example 4-1 of the present application.

Two different planar light source devices were produced and evaluated by the same procedure as in (2-1-2) and (2-1-3) in Example (2-1) except that the two different stacks obtained in (4-1-1) were used instead of the stack obtained in (2-1-1). The results are shown in FIGS. 24 and 25.

Example 4-2

4-2-1: Concavo-Convex Structure Layer

Figure 10:
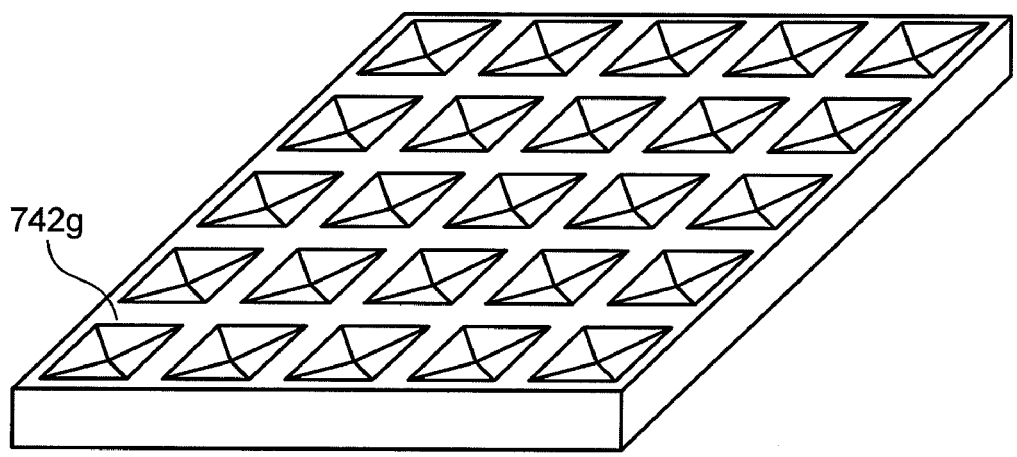
FIG. 10 is a schematic perspective view illustrating the shape of the concavo-convex structure layer shown in FIG. 9.
Figure 11:
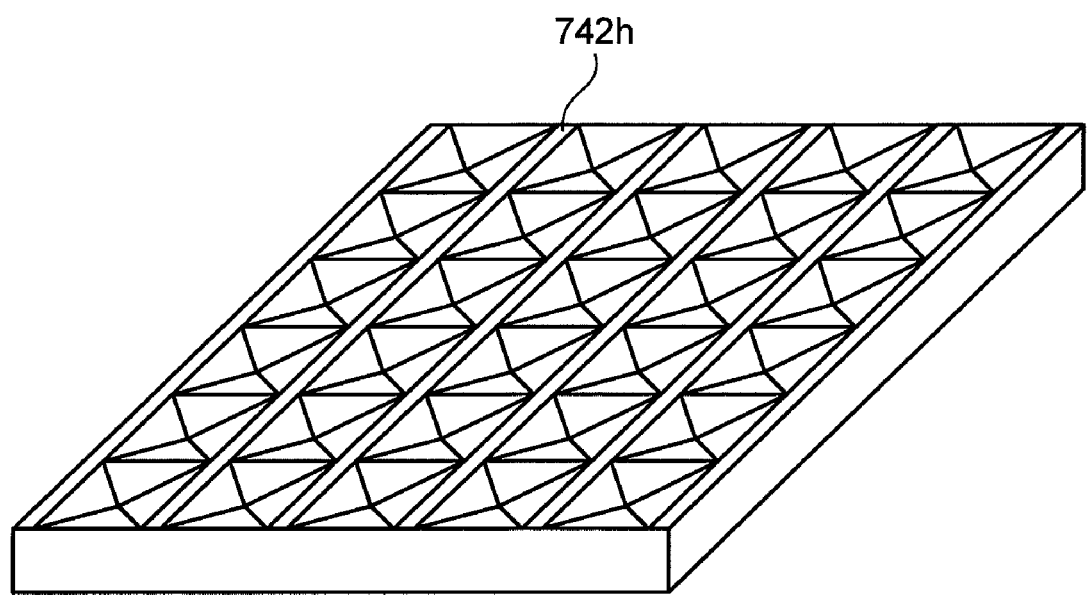
FIG. 11 is a schematic perspective view illustrating another example of the concavo-convex shape of the concavo-convex structure layer in the planar light source device of the present invention.

Two different layered stacks of the transparent film and the concavo-convex structure layer were obtained by the same procedure as in (2-1-1) in Example (2-1) except that the shape of the metal mold was changed. In the concavo-convex structure of each of the concavo-convex structure layers, quadrangular pyramid-shaped recesses each having a square bottom shape and a apex angle of 60° were arranged with flat spacing portions therebetween, as schematically shown in FIGS. 9 and 10. The pitch P91 of the repeated quadrangular pyramid shapes was 50 μm, and the side length P92 of the bottom surface of each quadrangular pyramid was 0.8 or 0.6 times the pitch, i.e., 40 μm or 30 μm. The width P93 of the flat spacing portion 742ƒ was 20 μm or 40 μm.

4-2-2: Planar Light Source Device

Figure 26:
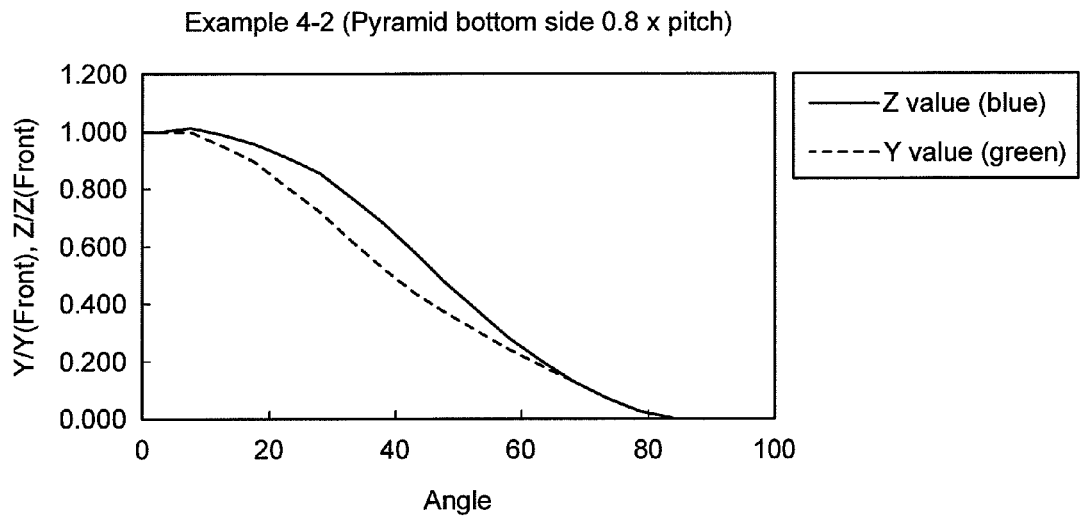
FIG. 26 is a graph showing the measurement results of the relationship between measurement angle and Y/Y (front direction) and Z/Z (front direction) in Example 4-2 of the present application.
Figure 27:
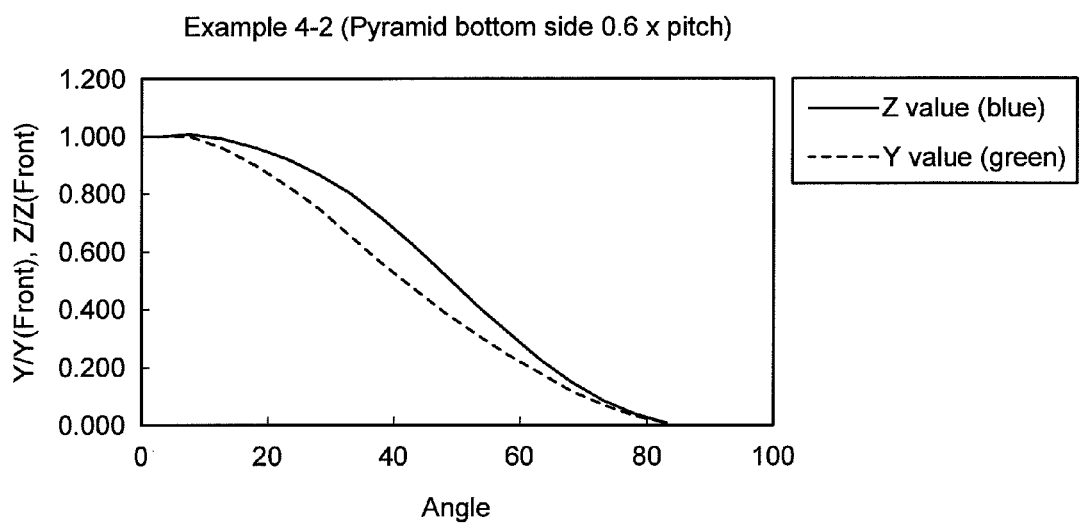
FIG. 27 is a graph showing the measurement results of the relationship between measurement angle and Y/Y (front direction) and Z/Z (front direction) in Example 4-2 of the present application.
Figure 28:
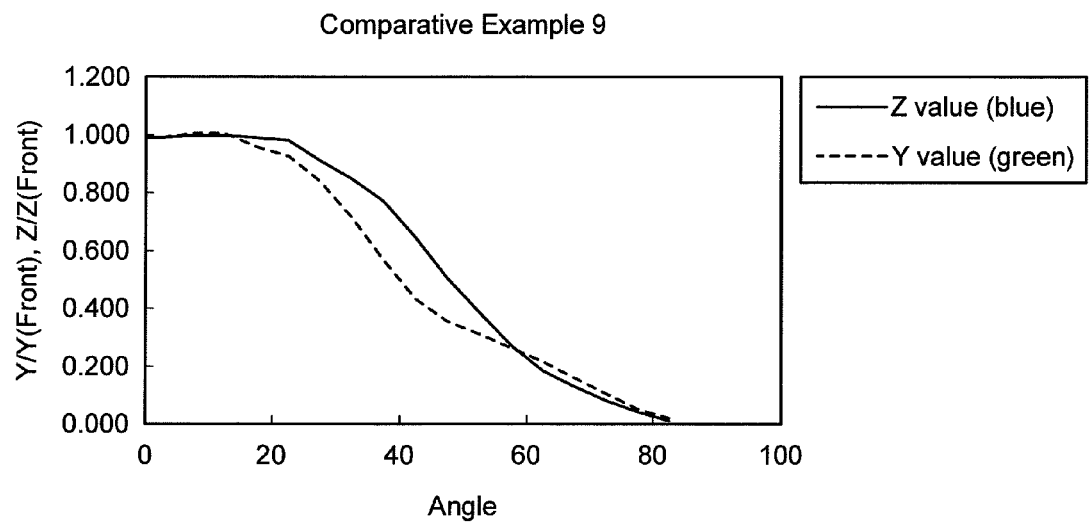
FIG. 28 is a graph showing the measurement results of the relationship between measurement angle and Y/Y (front direction) and Z/Z (front direction) in Comparative Example 9 of the present application.
Figure 29:
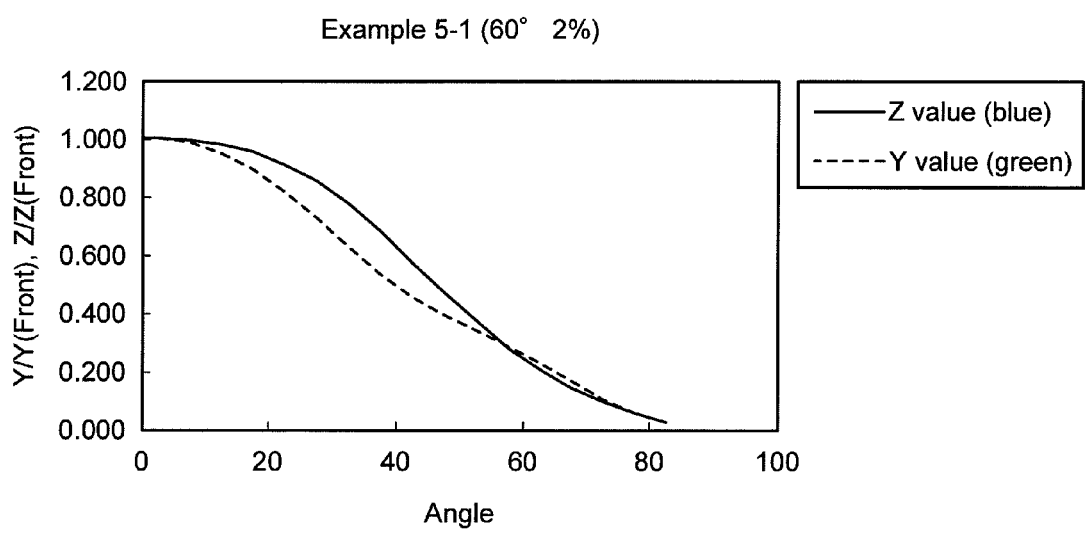
FIG. 29 is a graph showing the measurement results of the relationship between measurement angle and Y/Y (front direction) and Z/Z (front direction) in Example 5-1 of the present application.
Figure 30:
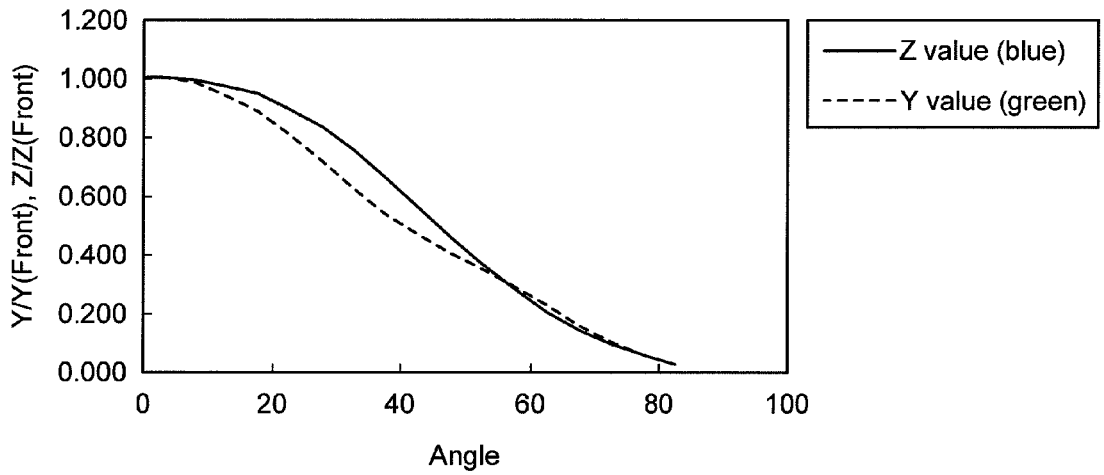
FIG. 30 is a graph showing the measurement results of the relationship between measurement angle and Y/Y (front direction) and Z/Z (front direction) in Example 5-2 of the present application.
Figure 31:
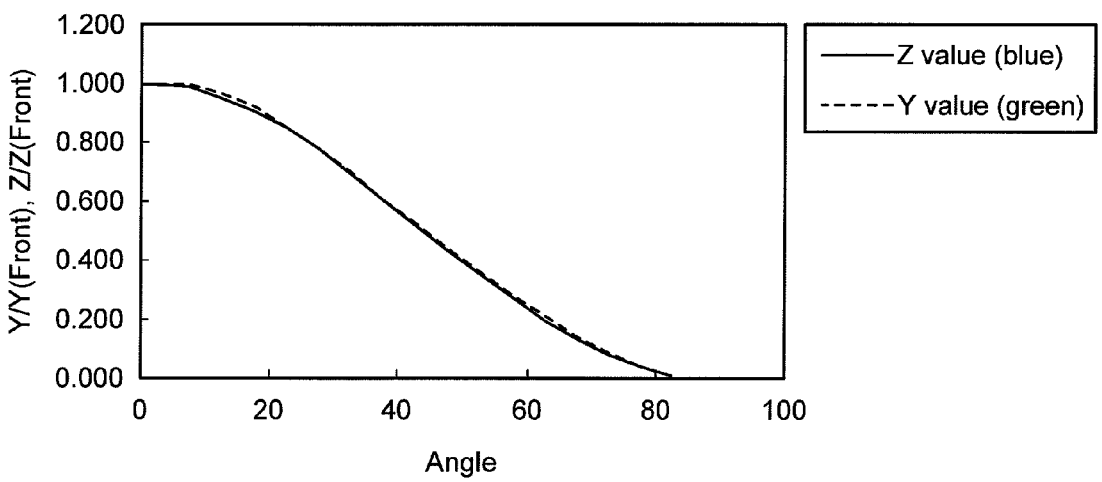
FIG. 31 is a graph showing the measurement results of the relationship between measurement angle and Y/Y (front direction) and Z/Z (front direction) in Example 5-3 of the present application.

Two different planar light source devices were produced and evaluated by the same procedure as in (2-1-2) and (2-1-3) in Example (2-1) except that the two different stacks obtained in (4-2-1) were used instead of the stack obtained in (2-1-1). The results are shown in FIGS. 26 and 27.

As can be seen by comparing the results of Examples 4-1 and 4-2 with the results of Comparative Examples 7 and 8, in the planar light source devices of the Comparative Examples, the light distribution characteristics of green color (the light distribution characteristics of the luminous intensity) were significantly different from the light distribution characteristics of blue color, and the planar light source devices were bluish when viewed in an oblique direction. However, in the planar light source devices of the present invention, the difference between the light distribution characteristics of blue color and the light distribution characteristics of green color was small. Therefore, a reduction in the degree of bluishness varying depending on the viewing angle was achieved. In other words, a planar light source device in which a change in color tone at different viewing angles is small can be provided.

As can be seen by comparing the results of Examples 4-1 and 4-2 with the results of Examples 2-1 and 2-2, even when flat surfaces are present in parts of the concavo-convex structure of the concavo-convex structure layer, optical effects close to those of the concavo-convex structure layer having no flat surfaces can be obtained. The structures of the concavo-convex structure layers in Examples 4-1 and 4-2, particularly the structure in Examples 4-2, have abrasion resistance better than that of the structure in Example 2-1. Therefore, the planar light source devices in Examples 4-1 and 4-2, particularly the planar light source device in Example 4-2, have optical performance equivalent to that of the planar light source device in Example 2-1 and are advantageous in that the abrasion resistance is better.

Examples 5-1 to 5-3 and Comparative Example 9

5-0-1: Concavo-Convex Structure Layer

Four different layered stacks each having a layer structure of (the transparent film)-(the concavo-convex structure layer)

were obtained by the same procedure as in (2-1-1) in Example (2-1) except that the shape of the metal mold was changed and the amount of the SiO$_2$ particles was changed. In the concavo-convex structure of each of the concavo-convex structure layers, quadrangular pyramid-shaped recesses each having a square bottom shape of 50 μm side and a apex angle of 60° were arranged without gaps therebetween. The angle between the light emitting surface and the inclined surfaces of the quadrangular pyramids was 60°. The amount of the SiO$_2$ particles was 0 wt % (Comparative Example 9), 2 wt % (Example 5-1), 3 wt % (Example 5-2), or 20 wt % (Example 5-3).

5-0-2: Planar Light Source Device

Different planar light source devices were produced and evaluated by the same procedure as in (2-1-2) and (2-1-3) in Example (2-1) except that the four different stacks obtained in (5-0-1) were used instead of the stack obtained in (2-1-1). The results are shown in FIGS. 28 to 31.

As can be seen by comparing the results of Examples 5-1 to 5-3 with the results of Comparative Example 9, in the planar light source device of the Comparative Example, the light distribution characteristics of green color (the light distribution characteristics of the luminous intensity) were significantly different from the light distribution characteristics of blue color, and the planar light source device was bluish when viewed in an oblique direction. However, in the planar light source devices of the present invention, the difference between the light distribution characteristics of blue color and the light distribution characteristics of green color was small. Therefore, a reduction in the degree of bluishness varying depending on the viewing angle was achieved. In other words, a planar light source device in which a change in color tone at different viewing angles is small can be provided.

As can be seen, as the amount of the particles increases, the difference in light distribution characteristics decreases.

Examples 6-1 to 6-3

6-0-1: Concavo-Convex Structure Layer

Three different layered stacks each having a layer structure of (the transparent film)-(the concavo-convex structure layer) were obtained by the same procedure as in (2-1-1) in Example (2-1) except that the shape of the metal mold was changed and the diameter of the SiO$_2$ particles was changed. In the concavo-convex structure of each of the concavo-convex structure layers, quadrangular pyramid-shaped recesses each having a square bottom shape of 50 μm side and a apex angle of 60° were arranged without gaps therebetween. The angle between the light emitting surface and the inclined surfaces of the quadrangular pyramids was 60°. The diameter of the SiO$_2$ particles was 1 μm (Example 6-1), 2 μm (Example 6-2), or 5 μm (Example 6-3).

6-0-2: Planar Light Source Device

Figure 32:
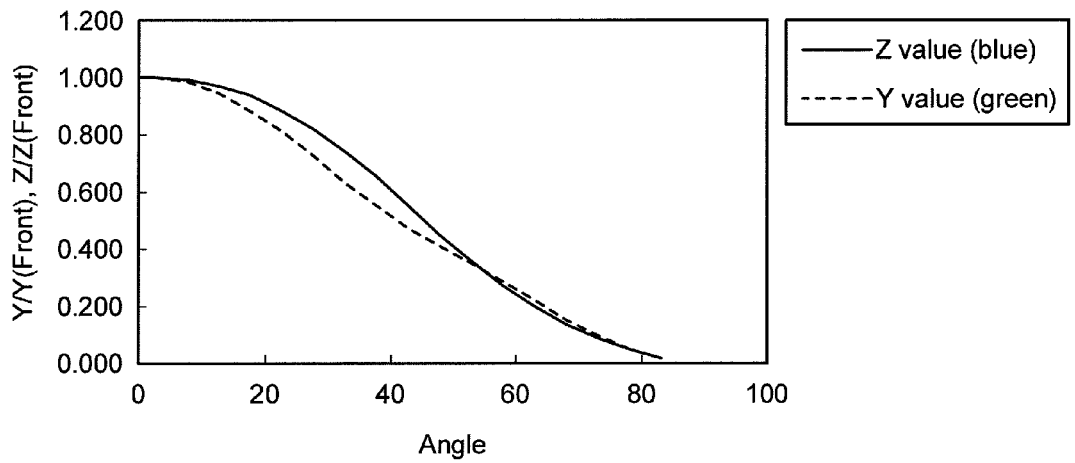
FIG. 32 is a graph showing the measurement results of the relationship between measurement angle and Y/Y (front direction) and Z/Z (front direction) in Example 6-1 of the present application.
Figure 33:
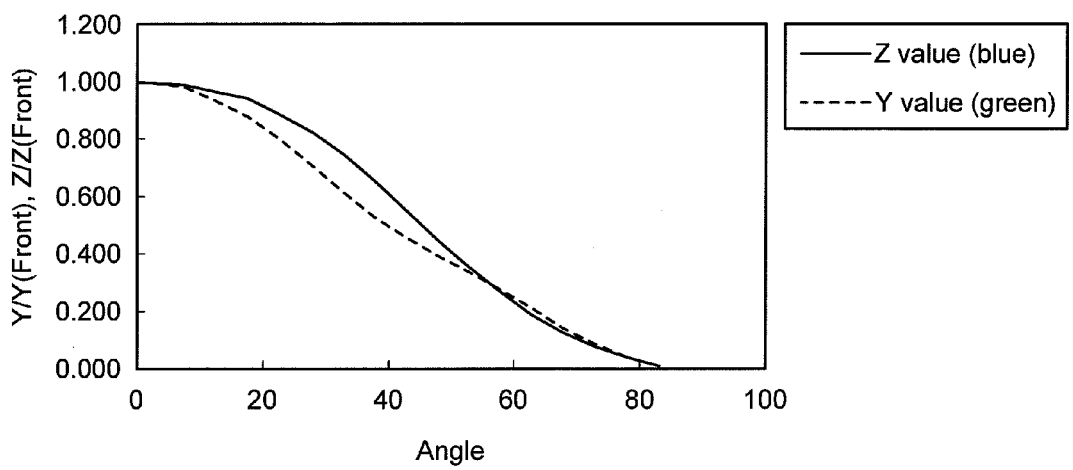
FIG. 33 is a graph showing the measurement results of the relationship between measurement angle and Y/Y (front direction) and Z/Z (front direction) in Example 6-2 of the present application.
Figure 34:
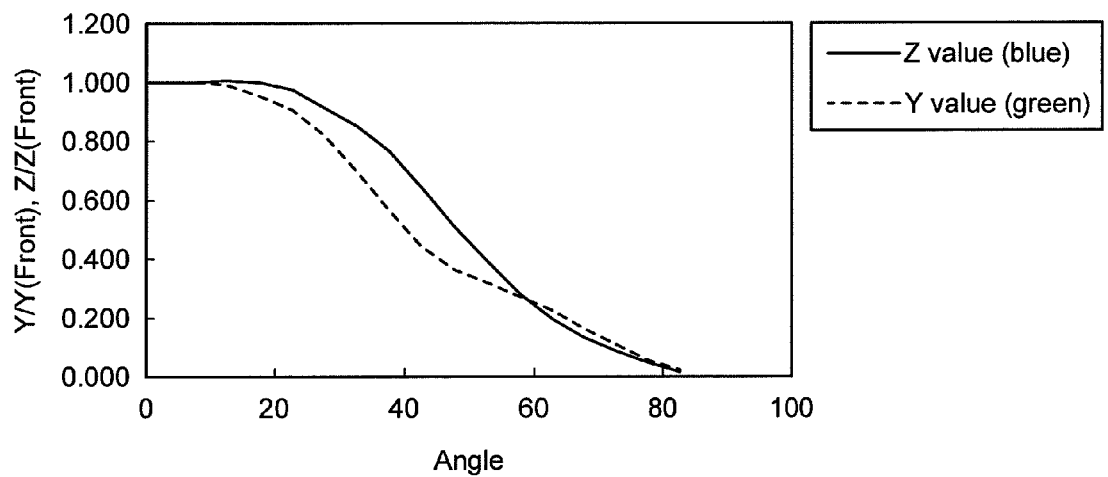
FIG. 34 is a graph showing the measurement results of the relationship between measurement angle and Y/Y (front direction) and Z/Z (front direction) in Example 6-3 of the present application.

Different planar light source devices were produced and evaluated by the same procedure as in (2-1-2) and (2-1-3) in Example (2-1) except that the three different stacks obtained in (6-0-1) were used instead of the stack obtained in (2-1-1). The results are shown in FIGS. 32 to 34.

As can be seen by comparing the results of Examples 6-1 to 6-3 with the results of Comparative Example 9, in the planar light source device of the Comparative Example, the light distribution characteristics of green color (the light distribution characteristics of the luminous intensity) were significantly different from the light distribution characteristics of blue color, and the planar light source device was bluish when viewed in an oblique direction. However, in the planar light source devices of the present invention, the difference between the light distribution characteristics of blue color and the light distribution characteristics of green color was small. Therefore, a reduction in the degree of bluishness varying depending on the viewing angle was achieved. In other words, a planar light source device in which a change in color tone at different viewing angles is small can be provided.

As can be seen, as the diameter of the particles decreases, the difference in light distribution characteristics decreases.

Example 7-1

7-1-1: Concavo-Convex Structure Layer

A layered stack having a layer structure of (the transparent film)-(the concavo-convex structure layer) was obtained by the same procedure as in (5-0-1) in Example (5-2) except that the UV (ultraviolet ray) curable urethane acrylic resin was changed to another one having a refractive index n=1.48 after curing.

7-1-2: Planar Light Source Device

Figure 35:
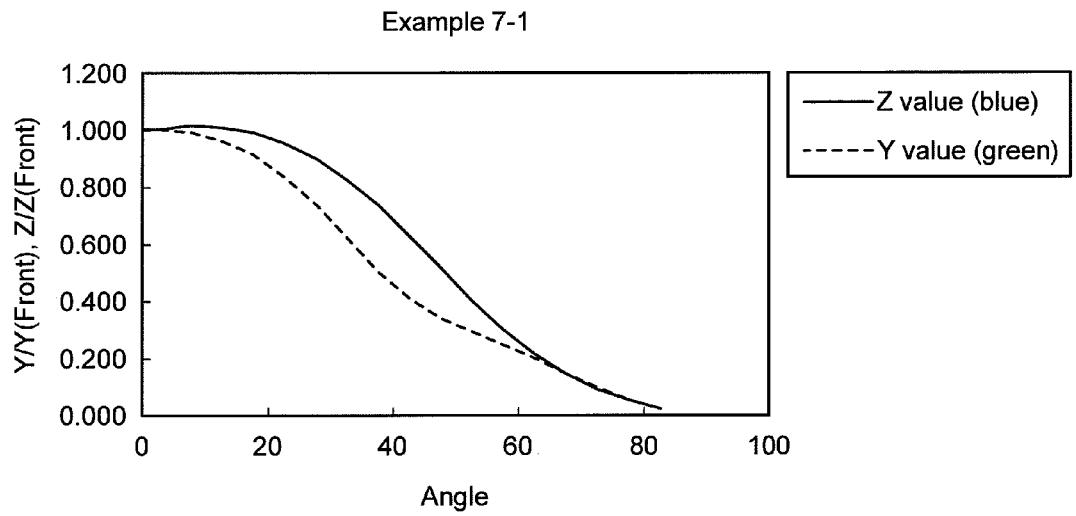
FIG. 35 is a graph showing the measurement results of the relationship between measurement angle and Y/Y (front direction) and Z/Z (front direction) in Example 7-1 of the present application.

A planar light source device was produced and evaluated by the same procedure as in (2-1-2) and (2-1-3) in Example (2-1) except that the stack obtained in (7-1-1) was used instead of the stack obtained in (2-1-1). The results are shown in FIG. 35.

Example 7-2

7-2-1: Concavo-Convex Structure Layer

A layered stack having a layer structure of (the transparent film)-(the concavo-convex structure layer) was obtained by the same procedure as in (5-0-1) in Example (5-2) except that the UV (ultraviolet ray) curable urethane acrylic resin was changed to another one having a refractive index n=1.48 after curing and, instead of the spherical SiO$_2$ particles, alumina particles (refractive index: 1.76, particle diameter: 2 μm) were added in an amount of 6 wt %.

7-2-2: Planar Light Source Device

Figure 36:
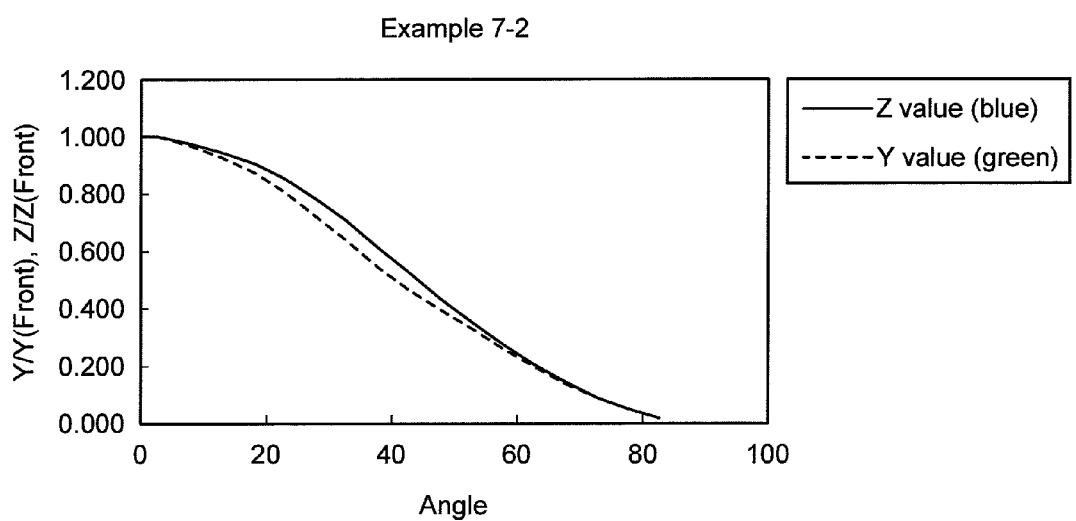
FIG. 36 is a graph showing the measurement results of the relationship between measurement angle and Y/Y (front direction) and Z/Z (front direction) in Example 7-2 of the present application.

A planar light source device was produced and evaluated by the same procedure as in (2-1-2) and (2-1-3) in Example (2-1) except that the stack obtained in (7-2-1) was used instead of the stack obtained in (2-1-1). The results are shown in FIG. 36.

As can be seen by comparing the results of Example 5-2 in which the difference in refractive index between the resin and the particles is 0.1, the results of Example 7-1 in which the difference in refractive index between the resin and the particles is 0.05, and the results of Example 7-2 in which the difference in refractive index between the resin and the particles is 0.28, advantageous effects can be obtained when the difference in refractive index is 0.05 or more, and more preferable effects are obtained when the difference in refractive index is larger.

The invention claimed is:
1. A planar light source device comprising: an organic EL luminescent element; and a concavo-convex structure layer made of a resin composition and formed on a light emitting surface of the planar light source device, wherein:
- the concavo-convex structure layer includes a plurality of concavo-convex structure portions arranged therein and having a cone, pyramid, or prism shape;
- the resin composition contains a transparent resin and particles;
- the particles have a diameter of 10 μm or less;
- the particles is contained in an amount of 1 to 40 wt % based on a total amount of the resin composition; and
- a difference in refractive index between the particles and the transparent resin is 0.05 to 0.5.

2. The planar light source device according to claim 1, wherein: the concavo-convex structure portion has an inclined surface; and the inclined surface and the light emitting surface form an angle of 55 to 70°.

3. The planar light source device according to claim 1, wherein the concavo-convex structure portion has a concave shape.

4. The planar light source device according to claim 1, wherein: the plurality of concavo-convex structure portions are arranged in two mutually crossing directions; and any adjacent concavo-convex structure portions are arranged without a gap therebetween.

5. The planar light source device according to claim 1, wherein: the plurality of concavo-convex structure portions are arranged in two mutually crossing directions; and any adjacent concavo-convex structure portions are arranged with a gap interposed therebetween only in one direction out of the two directions.

6. The planar light source device according to claim 5, wherein: the plurality of concavo-convex structure portions are arranged in two mutually crossing directions; and any adjacent concavo-convex structure portions are arranged with a gap interposed therebetween in both the two directions.

7. The planar light source device according to claim 1, wherein the concavo-convex structure portion is a quadrangular pyramid.

8. The planar light source device according to claim 1, wherein the concavo-convex structure layer has a ratio of the amount of the particles in unit area of the concavo-convex structure layer being $2 \times 10^3$ to $6 \times 10^{10}$ particles/cm$^2$.

* * * * *